US011462578B2

(12) United States Patent
Takahashi

(10) Patent No.: US 11,462,578 B2
(45) Date of Patent: *Oct. 4, 2022

(54) IMAGING DEVICE WITH UNIFORM PHOTOSENSITIVE REGION ARRAY

(71) Applicant: Taiwan Semiconductor Manufacturing Co., Ltd., Hsin-Chu (TW)

(72) Inventor: Seiji Takahashi, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/934,209

(22) Filed: Jul. 21, 2020

(65) Prior Publication Data

US 2020/0350348 A1 Nov. 5, 2020

Related U.S. Application Data

(63) Continuation of application No. 16/364,478, filed on Mar. 26, 2019, now Pat. No. 10,734,419.

(Continued)

(51) Int. Cl.
*H01L 27/146* (2006.01)
*H04N 5/374* (2011.01)

(52) U.S. Cl.
CPC .. *H01L 27/14605* (2013.01); *H01L 27/14636* (2013.01); *H01L 27/14643* (2013.01); *H04N 5/374* (2013.01)

(58) Field of Classification Search
CPC ......... H01L 27/14605; H01L 27/14636; H01L 27/14643; H01L 27/14621; H01L 27/14627; H01L 27/14609; H01L 27/146; H01L 27/14629; H01L 27/14601; H01L 27/1463; H01L 27/14683; H04N 5/374
See application file for complete search history.

(56) References Cited

U.S. PATENT DOCUMENTS 6,407,440 B1 6/2002 Rhodes
6,788,237 B1 9/2004 Bidermann et al.
(Continued)

OTHER PUBLICATIONS

Nongseo-Dong et al. "Gr Gb Difference in 3M CMOS Image Sensor with 1.75 μm Pixel." 2007 International Image Sensor Workshop, Ogunquit Maine, USA Jun. 7-10, 2007.

(Continued)

*Primary Examiner* — Syed I Gheyas
(74) *Attorney, Agent, or Firm* — Eschweiler & Potashnik, LLC

(57) ABSTRACT

Various embodiments of the present disclosure are directed towards an image sensor including a plurality of photodetectors within a substrate. A first plurality of semiconductor devices disposed over a first side of the substrate. A second plurality of semiconductor devices disposed over the first side of the substrate. The first and second plurality of semiconductor devices are disposed on opposing sides of the plurality of photodetectors such that the plurality of photodetectors are spaced laterally between the first and second plurality of semiconductor devices. The first and second plurality of semiconductor devices are laterally offset from the plurality of photodetectors.

20 Claims, 12 Drawing Sheets

Related U.S. Application Data

(60) Provisional application No. 62/753,298, filed on Oct. 31, 2018.

(56) References Cited

U.S. PATENT DOCUMENTS

| | | |
|---|---|---|
| 9,270,879 B2 | 2/2016 | Hamada |
| 9,609,250 B2 * | 3/2017 | Lee .................... H01L 27/14603 |
| 2006/0132633 A1 | 6/2006 | Nam et al. |
| 2010/0230583 A1 | 9/2010 | Nakata et al. |
| 2011/0169991 A1 | 7/2011 | Ku et al. |
| 2013/0009148 A1 | 1/2013 | Yamazaki |
| 2013/0049082 A1 | 2/2013 | Kato et al. |
| 2013/0221465 A1 | 8/2013 | Kim et al. |
| 2014/0103337 A1 | 4/2014 | Yamazaki et al. |
| 2014/0239152 A1 | 8/2014 | Chen et al. |
| 2016/0255295 A1 | 9/2016 | Fereyre et al. |
| 2016/0372504 A1 | 12/2016 | Kato et al. |
| 2018/0182804 A1 | 6/2018 | Lee et al. |
| 2018/0255215 A1 * | 9/2018 | Lee ..................... H04N 5/2253 |
| 2018/0261644 A9 | 9/2018 | Kato et al. |
| 2019/0057994 A1 * | 2/2019 | Huang .............. H01L 27/14627 |
| 2019/0140101 A1 | 5/2019 | Im et al. |
| 2020/0176603 A1 | 6/2020 | Baeck et al. |
| 2021/0242207 A1 | 8/2021 | Yamazaki |

OTHER PUBLICATIONS

Notice of Allowance dated Mar. 25, 2020 for U.S. Appl. No. 16/364,478.

* cited by examiner

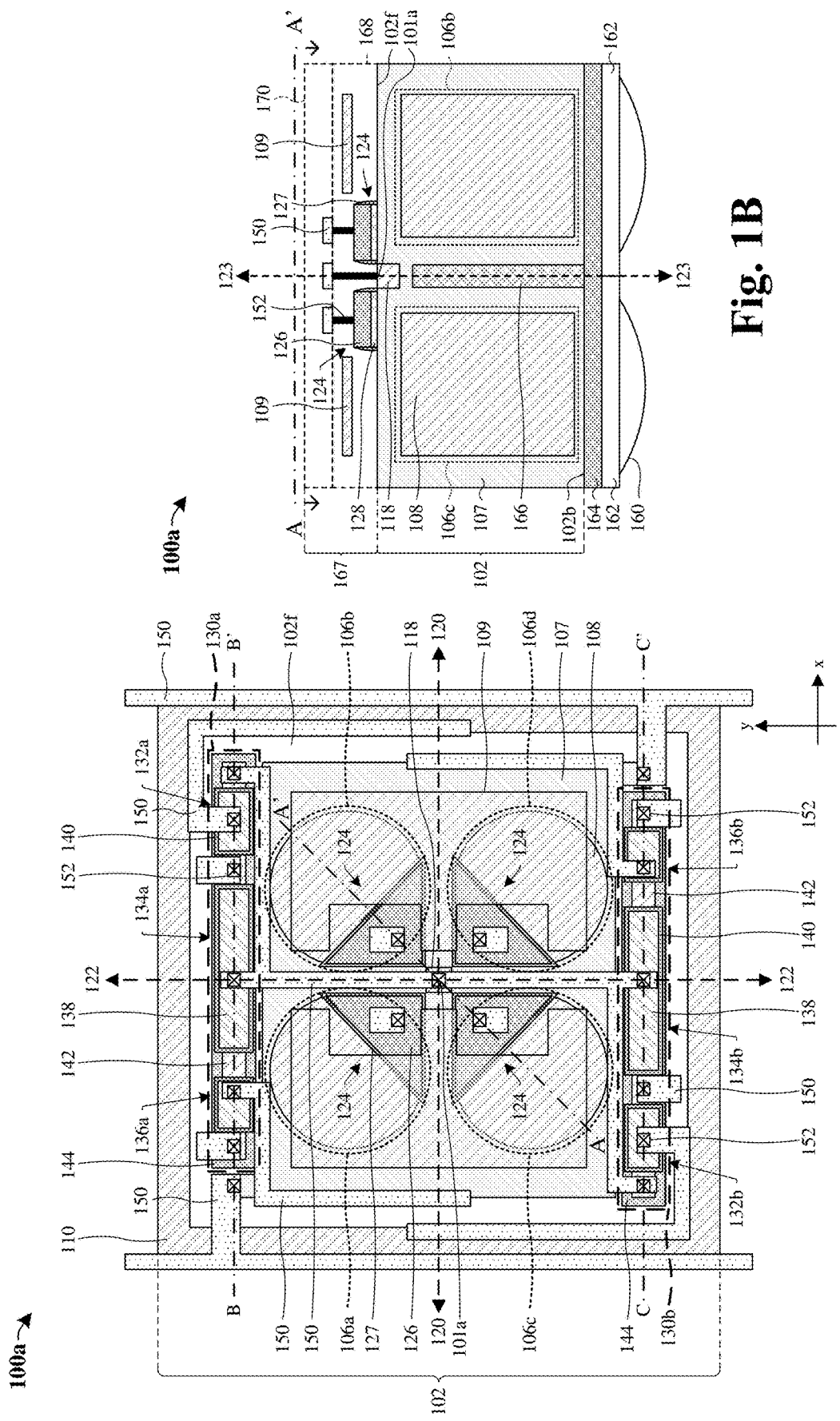

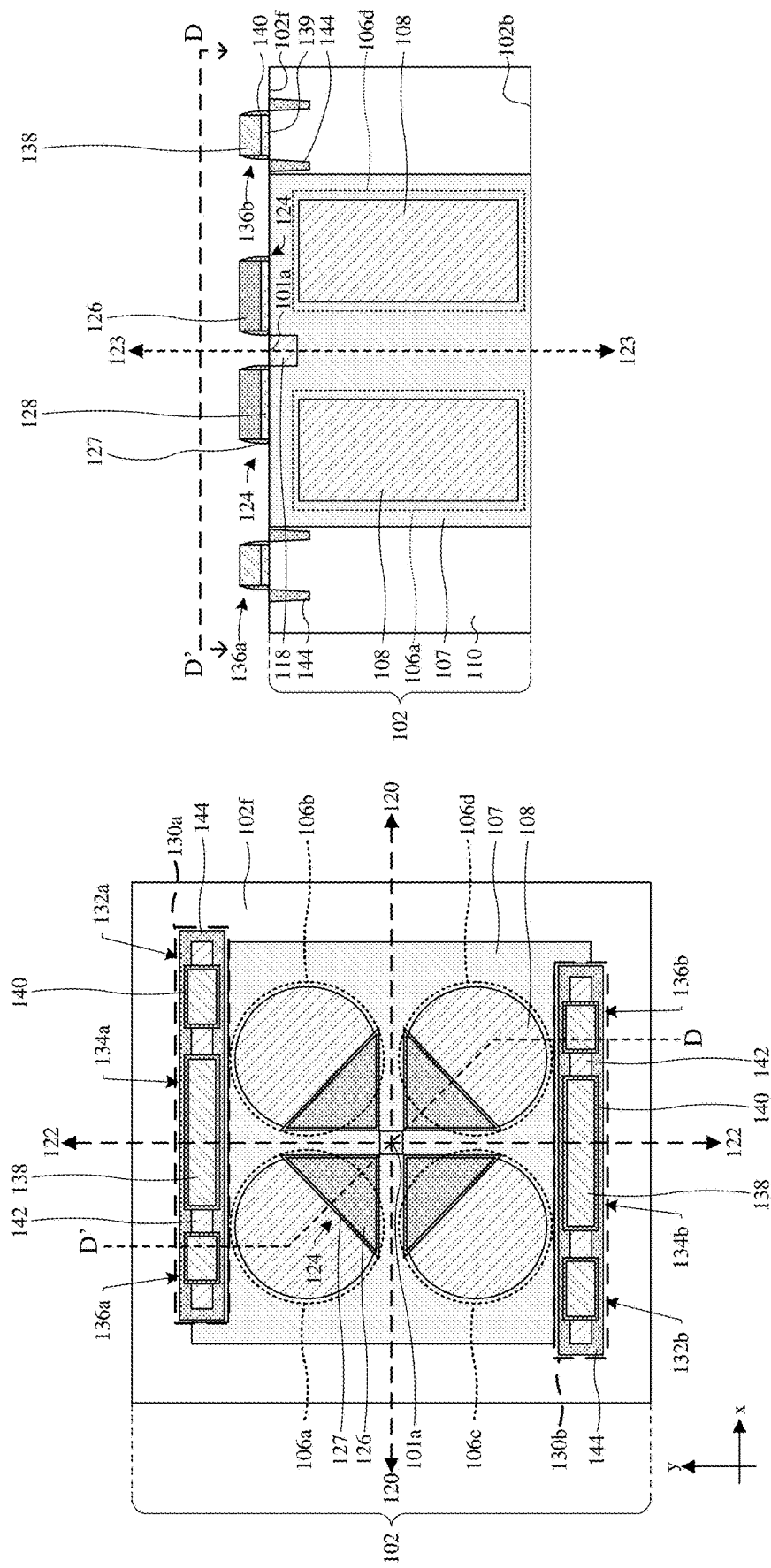

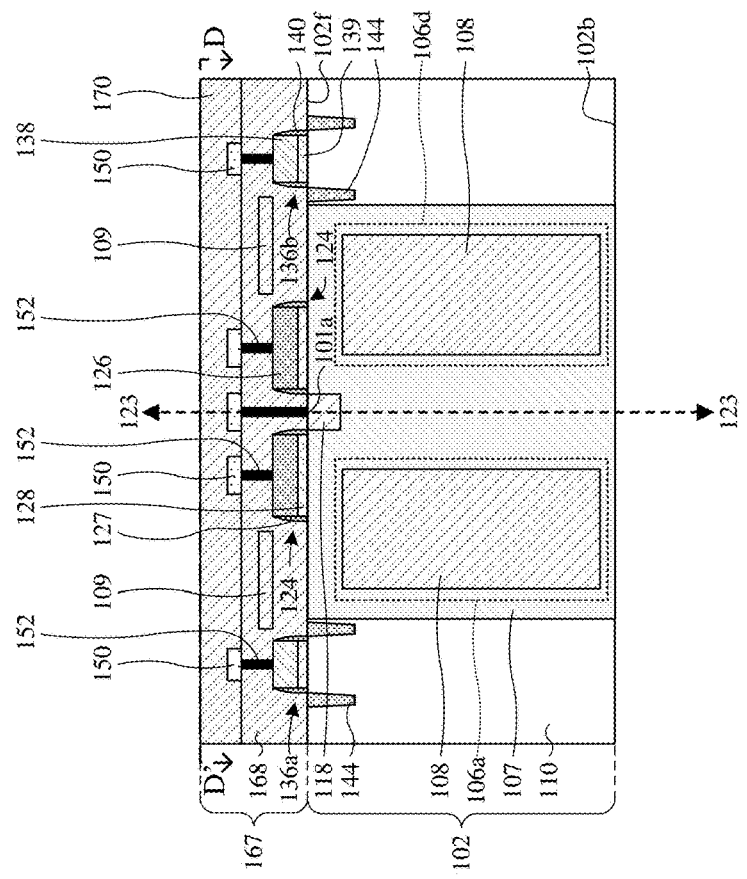
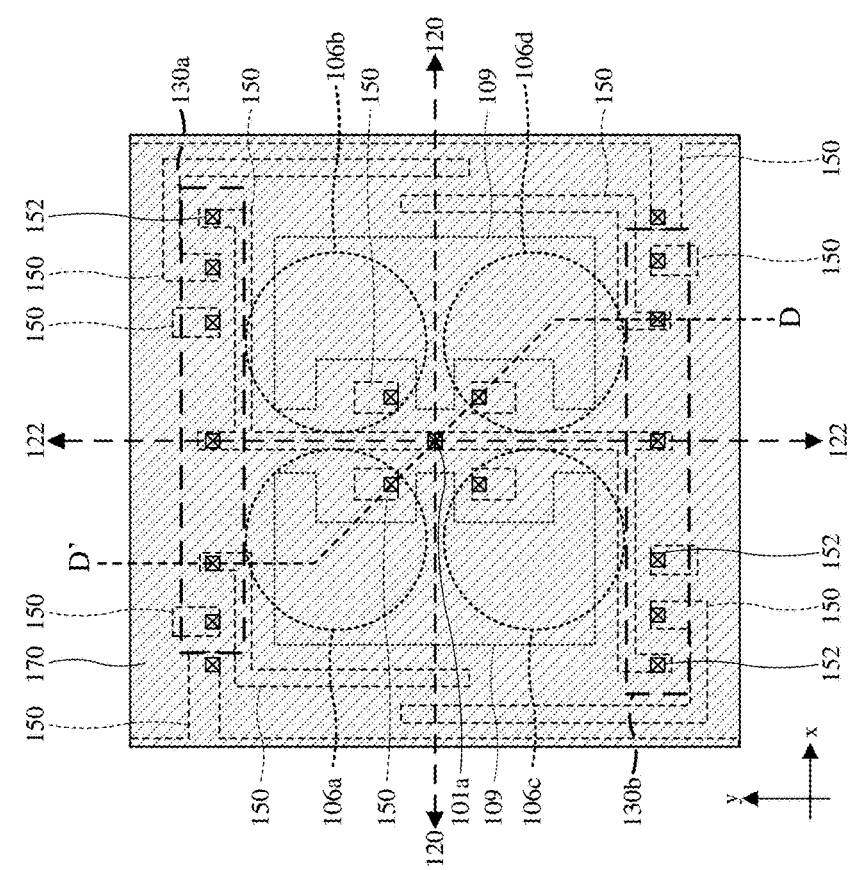
Fig. 8B
Fig. 8A

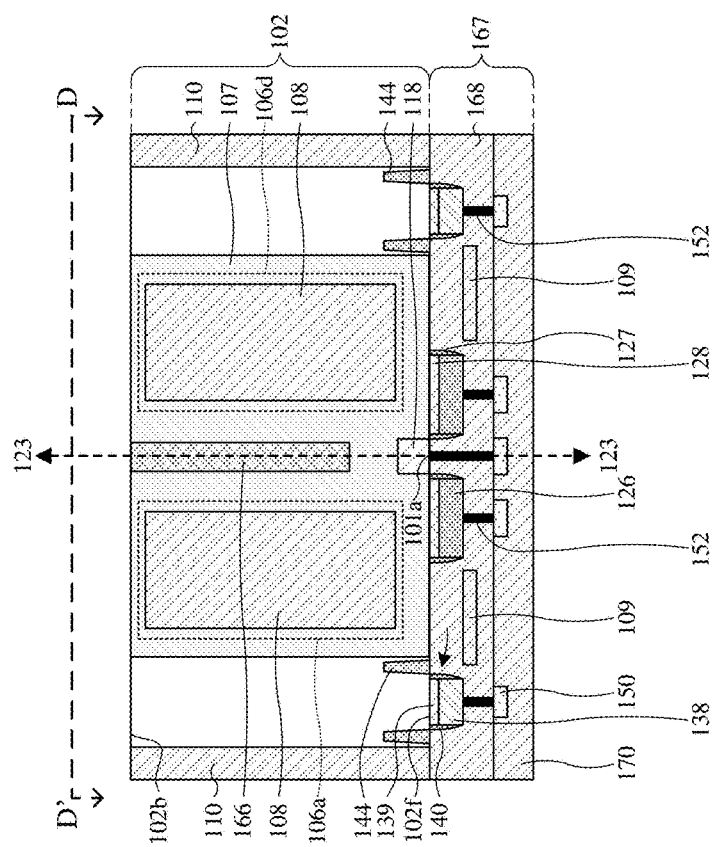
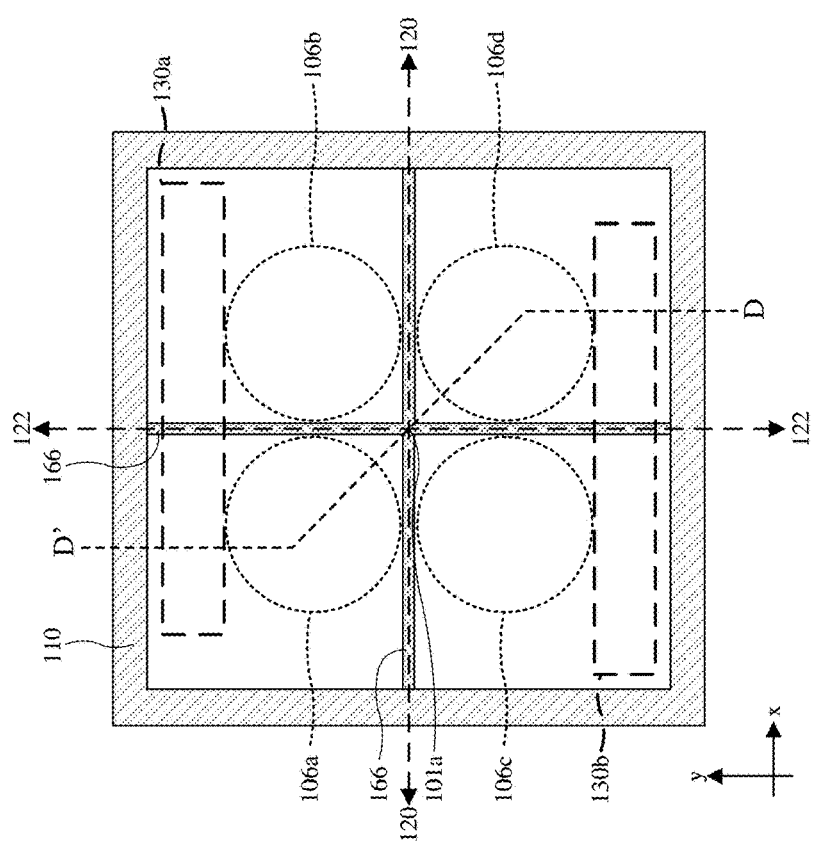
Fig. 9B
Fig. 9A

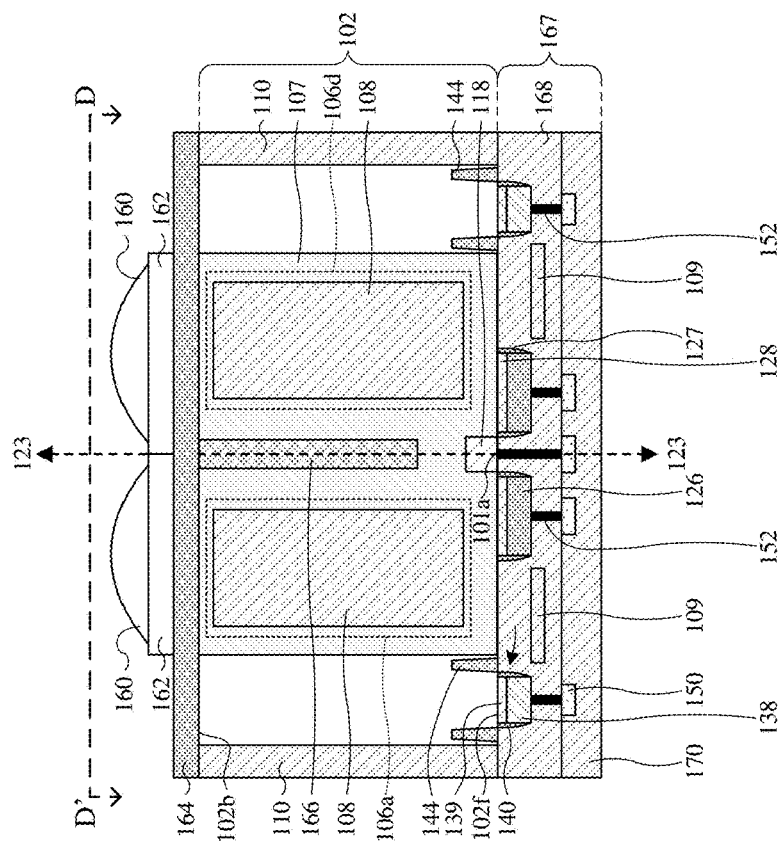
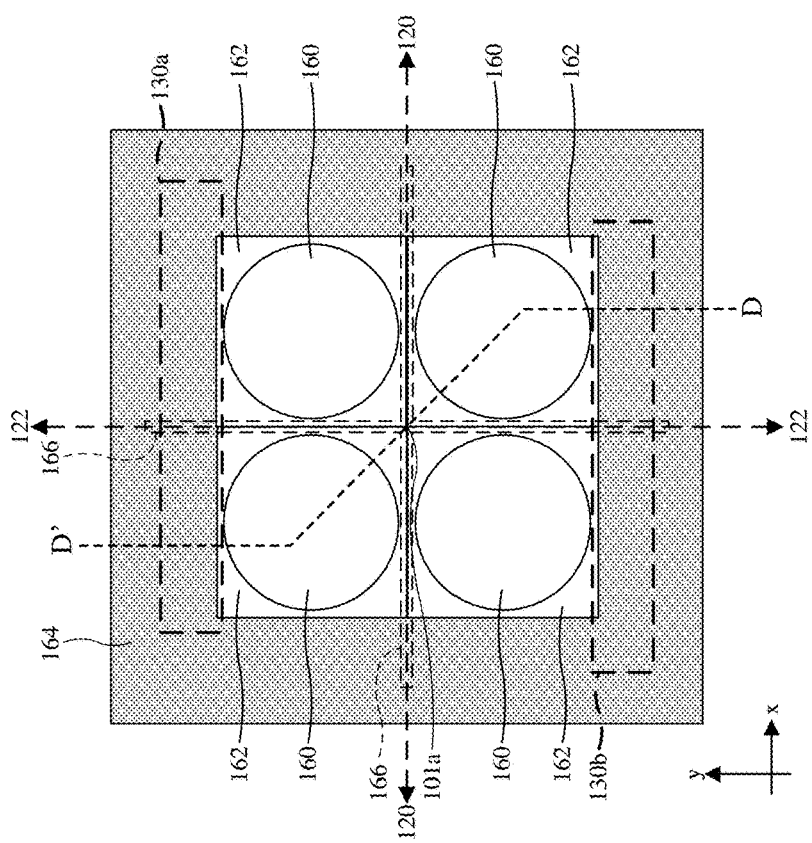
Fig. 10B
Fig. 10A

IMAGING DEVICE WITH UNIFORM PHOTOSENSITIVE REGION ARRAY

REFERENCE TO RELATED APPLICATIONS

This application is a Continuation of U.S. application Ser. No. 16/364,478, filed on Mar. 26, 2019, which claims the benefit of U.S. Provisional Application No. 62/753,298, filed on Oct. 31, 2018. The contents of the above-referenced patent applications are hereby incorporated by reference in their entirety.

BACKGROUND

Many modern day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors (CIS). Compared to CCD pixel sensors, CIS are favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1D illustrate various views of a pixel sensor having symmetry with respect to a center point of a plurality of photodetectors.

FIGS. 4A-4B through 10A-10B illustrate a series of various views of some embodiments of a method for forming the pixel sensor of FIG. 1A.

DETAILED DESCRIPTION

Figure 1C:
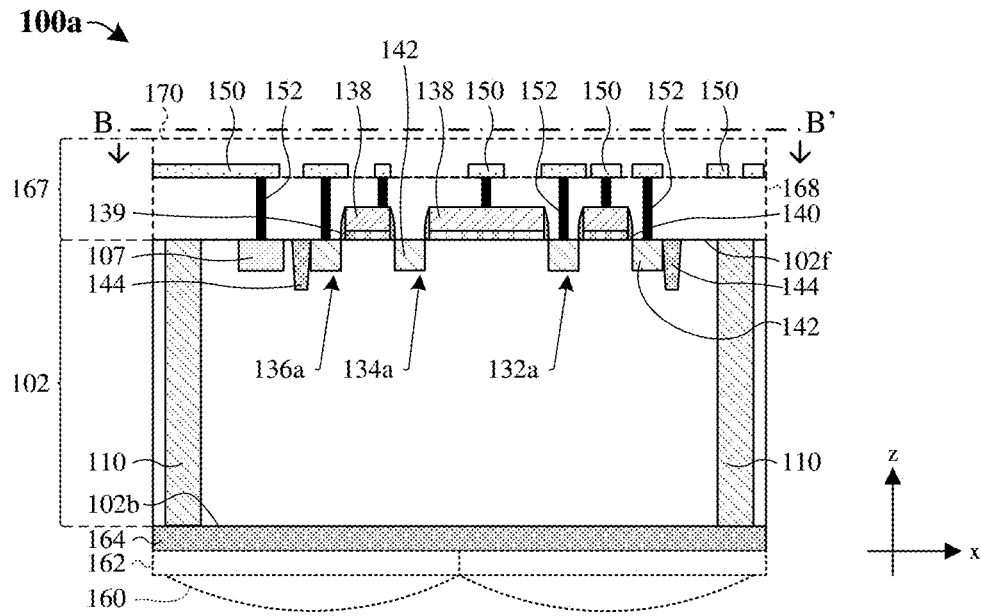

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide semiconductor image sensors (CISs) have an array of pixel sensors. A pixel sensor records incident radiation (e.g., visible light) using a photodetector, and facilitates digital readout of the recording with a plurality of pixel devices (e.g., a transfer transistor, a reset transistor, a source follower transistor, and/or a row-select transistor) disposed on a front-side of a semiconductor substrate. Some pixel sensors comprise an array of photodetectors (e.g., a 2×2 photodetector pixel sensor). In such pixel sensors, photodetector collector regions (each region corresponds to a photodetector in the array of photodetectors) are disposed in a pixel sensor well region of the semiconductor substrate. Deep trench isolation (DTI) structures separate the pixel sensor well region of each pixel sensor in the array of pixel sensors. Interconnect structures (e.g., metal wires and metal vias) provide electrical coupling to the array of pixel sensors and/or the plurality of pixel devices. The interconnect structures overlie the front-side of the semiconductor substrate. Metal reflectors configured to reflect incident radiation back to the photodetector collector regions overlie the front-side of the semiconductor substrate. Due to device scaling, the individual pixel sensors have smaller dimensions and are closer to one another, and thus room for each photodetector collector regions is more limited.

One challenge with the above pixel sensor is a non-uniform pixel-to-pixel sensitivity across the array of pixel sensors. The non-uniform pixel-to-pixel sensitivity is due to a lack of symmetry with the placement of the interconnect structures, metal reflectors, and the plurality of pixel devices over/around the pixel sensor well region. This lack of symmetry causes an imbalance in a magnitude and/or a phase of the incident radiation disposed upon each photodetector collector region. For example, as incident radiation is disposed upon a back-side (the back-side is opposite the front-side) of the semiconductor substrate it hits the photodetector collector regions. However, a portion of the incident radiation radiates through the semiconductor substrate to the front-side of the semiconductor substrate and interacts with (reflects off of and/or is absorbed by) conductive materials within the plurality of pixel devices and the interconnect structure. A non-symmetric layout in the plurality of pixel devices and the interconnect structure causes the interaction across the photodetector collector regions to be imbalanced, such that when equal amounts of incident light are present for a first and a second photodetector collector region, the first photodetector collector region will receive less incident radiation than the adjacent second photodetector collector region. In yet another example, a 2×2 photodetector pixel sensor may be arranged in a Bayer pattern which consists of a Red photodetector, a Blue photodetector, a first Green photodetector (Gr), and a second Green photodetector (Gb). As the photodetector collector regions decreases in size, the lack of symmetry across the array of pixel sensors causes an imbalance in the sensitivity between Gr and Gb. The imbalance in sensitivity between Gr and Gb may, for example, cause conspicuous fixed-pattern noise (FPN) in images produced from the 2×2 photodetector pixel sensor.

The present application is directed towards a pixel sensor having a plurality of photodetectors. The pixel sensor records incident radiation using the plurality of photodetectors, and facilitates digital readout of the recording with a plurality of pixel devices. An interconnect structure overlying the pixel sensor provides electrical coupling to the plurality of photodetectors and the plurality of pixel devices. Reflectors overlie the plurality of photodetectors. The pixel sensor is surrounded by a DTI structure. The interconnect structure, the reflectors, and the plurality of pixel devices are point symmetric with respect to a center point of the plurality of photodetectors. The point symmetry of the aforementioned structures and devices may, for example, cause interactions (reflections and/or absorptions) between materials of the aforementioned structures and devices and the incident radiation to be uniform, such that each photodetector receives approximately a same magnitude and/or phase of incident radiation. In some examples, there may be an array of such aforementioned pixel sensors, such that the symmetry of each pixel sensor may mitigate non-uniform pixel-to-pixel sensitivity across an array of pixel sensors. The mitigation of non-uniform pixel-to-pixel sensitivity across the array of pixel sensors increases as the individual pixel sensors have smaller dimensions and are closer to one another. Thus, the point symmetry increases uniformity across the array of pixel sensors thereby mitigating the conspicuous FPN in images produced from the pixel sensors.

Figure 1D:
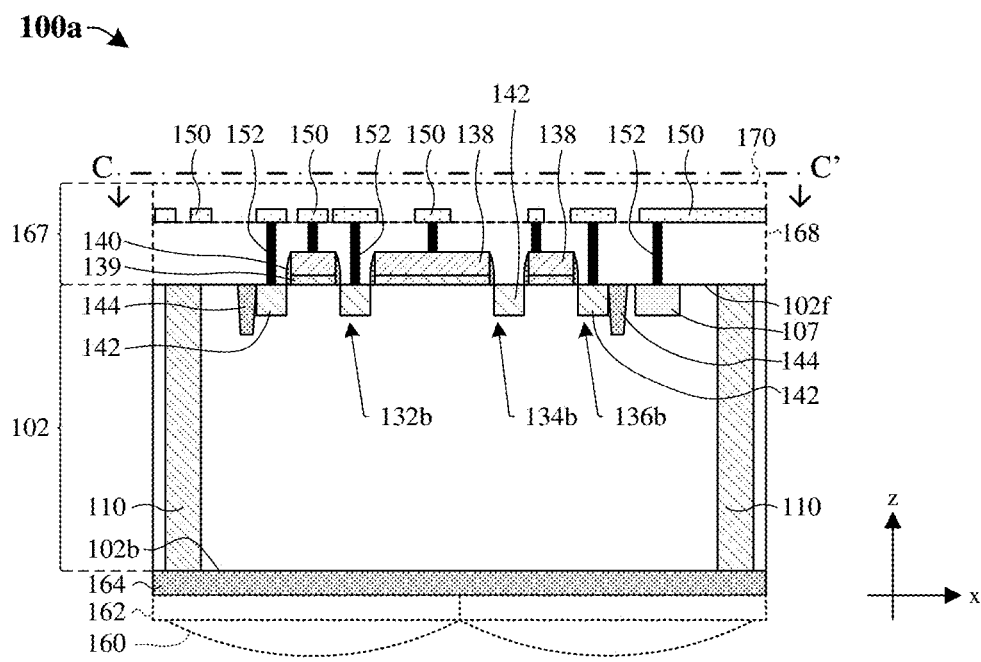

FIGS. 1A-1D illustrate various views of some embodiments of a pixel sensor 100a comprising symmetry with respect to a center point 101a of a plurality of photodetectors 106a-d. FIG. 1A illustrates a layout view of the pixel sensor 100a from a front-side 102f of a semiconductor substrate 102. FIG. 1B illustrates a cross-sectional view taken along line A-A' of FIG. 1A. FIG. 1C illustrates a cross-sectional view taken along line B-B' of FIG. 1A. FIG. 1D illustrates a cross-sectional view taken along line C-C' of FIG. 1A.

As shown in FIG. 1A, the pixel sensor 100a comprises a pixel sensor well region 107 disposed in the semiconductor substrate 102. In some embodiments, the semiconductor substrate 102 comprises any type of semiconductor body (e.g., monocrystalline silicon/CMOS bulk, silicon-germanium (SiGe), silicon on insulator (SOI), etc.). The pixel sensor well region 107 is a region of the semiconductor substrate 102 having a first doping type (e.g., p-type doping).

The plurality of photodetectors 106a-d are disposed in the semiconductor substrate 102. In some embodiments, the pixel sensor 100a is arranged in an array comprising a plurality of rows (e.g., along an x-axis) and columns (e.g., along a y-axis) of similar pixel sensors. In further embodiments, the pixel sensor 100a in the array is respectively separated from adjacent pixel sensors by a deep trench isolation (DTI) structure 110. The DTI structure 110 extends from a front-side 102f of the semiconductor substrate 102 to a back-side 102b of the semiconductors substrate 102. The photodetectors 106a-d are configured to absorb incident radiation (e.g., photons) and generate respective electrical signals corresponding to the incident radiation. In some embodiments, each of the photodetectors 106a-d comprise a photodetector collector region 108 disposed in the pixel sensor well region 107. The photodetector collector regions 108 are discrete regions of the semiconductor substrate 102 having a second doping type (e.g., n-type doping) opposite the first doping type. In some embodiments, a depletion region forms (e.g., due to p-n junctions between the photodetector collector regions 108 and the pixel sensor well region 107) within each photodetector collector region 108.

The plurality of photodetectors 106a-d comprise a first photodetector 106a, a second photodetector 106b, a third photodetector 106c, and a fourth photodetector 106d. In some embodiments, a first substantially straight line axis 120 extends in a first direction (e.g., along the x-axis) and intersects the center point 101a of the photodetectors 106a-d. A second substantially straight line axis 122 extends in a second direction (e.g., along the y-axis) that is perpendicular to the first substantially straight line axis 120 and intersects the center point 101a of the photodetectors 106a-d. A third substantially straight line axis 123 extends in a third direction (e.g., along the z-axis) that is perpendicular to the first and second substantially straight line axes 120, 122 and intersects the center point 101a of the photodetectors 106a-d. In some embodiments, the photodetectors 106a-d are reflection symmetric with respect to the first substantially straight line axis 120. As used herein, reflection symmetric is defined as a structure and/or a set of structures that may be divided along a line of symmetry into two parts, such that when one part is folded along the line of symmetry it coincides with the other part. For example, for a structure and/or a set of structures that are reflection symmetric, if a line of symmetry is drawn at a midpoint of the structure and/or at a midpoint between the set of structures and the structure and/or the set of structures were folded in half over the line of symmetry, then the two halves would be identical. Further, reflection symmetric as used herein contemplates that some small asymmetries, such as due to tolerances (e.g., during formation of a device), may be present in the points and/or part of the structure and/or the set of structures that are reflection symmetric. In further embodiments, the photodetectors 106a-d are reflection symmetric with respect to the second substantially straight line axis 122. In yet further embodiments, the first and fourth photodetectors 106a, 106d are reflection symmetric with respect to the third substantially straight line axis 123. In some embodiments, the second and third photodetectors 106b-c are reflection symmetric with respect to the third substantially straight line axis 123. In further embodiments, centers of the photodetectors 106a-d are equidistant from the center point 101a of the photodetectors 106a-d. In some embodiments, a center of the pixel sensor well region 107 is disposed at the center point 101a of the photodetectors 106a-d.

The symmetry of the photodetectors 106a-d with respect to the aforementioned substantially straight line axes (e.g., the first, second, and third substantially straight line axes 120, 122, 123) mitigates non-uniform photodetector-to-photodetector sensitivity across the photodetectors 106a-d. The mitigation of non-uniform photodetector-to-photodetector sensitivity increases as a size of the pixel sensor 100a decreases and the photodetectors 106a-d become closer together. In some embodiments, for example, if the photodetectors 106a-d are arranged in a Bayer pattern, then the first photodetector 106a may be configured as a Blue photodetector, the second photodetector 106b may be configured as a first Green photodetector (Gb), the third photodetector 106c may be configured as a second Green photodetector (Gr), and the fourth photodetector 106d may be configured as a Red photodetector. The symmetry across the photodetectors 106a-d mitigates an imbalance in the sensitivity between Gb (e.g., the second photodetector 106b) and Gr (e.g., the third photodetector 106c). The mitigation of the imbalance between Gb and Gr may reduce conspicuous fixed-pattern noise (FPN) in images produced from the pixel sensor 100a.

In further embodiments, a plurality of transfer transistors are disposed over each of the photodetectors 106a-d. The plurality of transfer transistors are point symmetric with respect to the center point 101a of the photodetectors. As used herein, point symmetric is defined as every point and/or part of a structure and/or a set of structures has a matching point and/or part in the opposite direction a same distance from the respective central point. Further, point symmetric as used herein contemplates that some small asymmetries, such as due to tolerances (e.g., during formation of a device), may be present in the points and/or part of the structure and/or the set of structures that are point symmetric. Centers of each transfer transistor are equidistant from the center point 101a of the photodetectors 106a-d. In some embodiments, metal reflectors are disposed over the front-side 102f of the semiconductor substrate 102. The metal reflectors are point symmetric with respect to the center point 101a of the photodetectors 106a-d. In further embodiments, a plurality of pixel devices (e.g., transistor(s), varactor(s), floating node(s), resistor(s), etc.) are disposed on a front-side 102f of the semiconductor substrate 102 within inner sidewalls of the DTI structure 110. The plurality of pixel devices are point symmetric with respect to the center point 101a of the photodetectors 106a-d. An interconnect structure comprising metal contacts, wires, and vias overlie the front-side 102f of the semiconductor substrate 102. The interconnect structure may comprise a plurality of metal layers vertically offset one another (e.g., a first metal layer M1 comprising a first plurality of metal wires is vertically between the front-side 102f of the semiconductor substrate 102 and a second metal layer M2 comprising a second plurality of metal wires). The metal contacts, wires, and vias of the interconnect structure within outer sidewalls of the DTI structure 110 are point symmetric with respect to the center point 101a of the photodetectors 106a-d.

As incident radiation is disposed on the pixel sensor 100a, the incident radiation will interact with (e.g., reflect off and/or be absorbed by) the aforementioned structures adjacent to the photodetectors 106a-d (e.g., transistors, pixel devices, and metal interconnect structures such as metal contacts, vias, and wires). The interactions with the adjacent structures will affect the amount of incident radiation each photodetector 106a-d will receive, thereby affecting the electrical signal generated by each photodetector 106a-d. In some embodiments, for example, if the adjacent structures are not symmetric with respect to the center point 101a, then the amount of radiation that is disposed on each photodetector will be non-uniform. For example, metal materials (such as tantalum nitride) may react (e.g., absorb) with the incident radiation, a non-uniform layout of structures comprising metal adjacent to the photodetectors may result in less incident radiation reaching a photodetector with more adjacent metal materials than a photodetector with less adjacent metal materials. This non-uniformity decreases photodetector-to-photodetector sensitivity and may result in FPN, thus decreasing the quality of images reproduced from the photodetectors. Therefore, symmetry of the aforementioned transistors, devices, and metal structures (e.g., metal contacts, vias, and wires) mitigates non-uniform photodetector-to-photodetector sensitivity across the photodetectors 106a-d. This, in turn, may mitigate conspicuous FPN in images produced by the photodetectors 106a-d, thereby increasing the quality of images reproduced from the photodetectors 106a-d.

The following paragraphs outline non-limiting examples of structures, devices, and/or regions adjacent to the photodetectors 106a-d and their respective type of symmetry with respect to the center point 101a of the photodetectors 106a-d, the first, second, and/or third substantially straight line axes 120, 122, 123.

A floating diffusion node 118 is disposed in the pixel sensor well region 107. The floating diffusion node 118 is a region of the semiconductor substrate 102 having the second doping type (e.g., n-type doping). A center point of the floating diffusion node 118 is aligned with the center point 101a of the photodetectors 106a-d. In some embodiments, the center point of the floating diffusion node 118 is spaced about equidistant from the centers of the photodetectors 106a-d.

A plurality of transfer transistors 124 are disposed on the front-side 102f of the semiconductor substrate 102. The transfer transistors 124 are disposed between the floating diffusion node 118 and the centers of each photodetector 106a-d. The transfer transistors 124 may selectively form a conductive channel between the photodetectors 106a-d and the floating diffusion node 118 to transfer accumulated charge (e.g., via absorbing incident radiation) in the photodetectors 106a-d to the floating diffusion node 118. In some embodiments, the transfer transistors 124 each comprise a transfer gate electrode 126 disposed on a transfer transistor gate dielectric 128, such that the transfer transistor gate dielectric 128 separates the transfer transistor gate electrode 126 from the front-side 102f of the semiconductor substrate 102. Transfer transistor sidewall spacers 127 are disposed along sidewalls of the transfer transistor gate electrodes 126 and the transfer transistor gate dielectrics 128. In some embodiments, the plurality of transfer transistors 124 are reflection symmetric with respect to the second substantially straight line axis 122. In further embodiments, the plurality of transfer transistors 124 are reflection symmetric with respect to the first substantially straight line axis 120. In yet further embodiments, centers of the transfer transistors 124 are equidistant from the center point 101a of the photodetectors 106a-d. In some embodiments, the transfer transistors 124 are point symmetric with respect to the center point 101a of the photodetectors 106a-d. In some embodiments, a center point of the plurality of transfer transistors is aligned with the center point 101a of the photodetectors 106a-d.

In some embodiments, reflectors 109 are disposed over the front-side 102f of the semiconductor substrate 102. An inter-level dielectric (ILD) structure 168 separates the reflectors 109 from the front-side 102f of the semiconductor substrate 102.

The ILD structure 168 may comprise one or more stacked ILD layers, which respectively comprise a low κ dielectric (i.e., a dielectric with a dielectric constant less than about 3.9), an oxide, or the like. The ILD structure 168 is not shown in FIG. 1A to more easily see the layout of layers and devices disposed over the first-side 102f of the semiconductor substrate 102. In some embodiments, a bottom surface of the reflectors 109 are laterally offset and vertically aligned with a top surface of the transfer gate electrode 126 of the transfer transistors 124. In further embodiments, the reflectors 109 are respectively vertically between a top surface of the transfer transistors 124 and a bottom surface of a first layer of metal layers overlying the front-side 102f of the semiconductor substrate 102. In some embodiments, the reflectors 109 are comprised of a metal material. The reflectors 109 are configured to reflect incident radiation disposed on the back-side 102b of the semiconductor substrate 102 that passes through the front-side 102f of the semiconductor substrate 102 back to the photodetectors 106a-d. In some embodiments, the reflectors 109 are reflection symmetric with respect to the first substantially straight line axis 120. In further embodiments, the reflectors 109 are reflection symmetric with respect to the second substantially straight line axis 122. In yet further embodiments, centers of the reflectors 109 are equidistant from the center point 101a of the photodetectors 106a-d.

A first pixel device region 130a and a second pixel device region 130b are laterally between the pixel sensor well region 107 and the DTI structure 110. It may be appreciated that any number and/or type (e.g., varactor(s), floating node(s), resistor(s), capacitor(s), etc.) of pixel devices may be disposed within the first and second pixel device regions 130a, 130b. Therefore, the first and second pixel device regions 130a, 130b in FIGS. 1A, 1C, and 1D are merely non-limiting examples. In some embodiments, the first pixel device region 130a comprises a first reset transistor 132a, a first source follower transistor 134a, and/or a first row-select transistor 136a. In some embodiments, the second pixel device region 130b comprises a second reset transistor 132b, a second source follower transistor 134b, and/or a second row-select transistor 136b. The first and second reset transistors 132a-b, the first and second source follower transistors 134a-b, and the first and second row-select transistors 136a-b each comprise a pixel device gate electrode 138 stacked over a pixel device gate dielectric 139. Pixel device sidewall spacers 140 are respectively disposed along sidewalls of the pixel device gate electrodes 138 and sidewalls of the pixel device gate dielectrics 139.

The first and second reset transistors 132a-b, the first and second source follower transistors 134a-b, and the first and second row-select transistors 136a-b each comprise source/drain regions 142 disposed on opposite sides of respective pixel device gate electrodes 138. In some embodiments, the source/drain regions 142 are regions of the semiconductor substrate 102 having the second doping type (e.g., n-type doping). At least one of the source/drain regions 142 is a common source/drain region 142 shared by the first reset transistor 132a and the first source follower transistor 134a. Another one of the source/drain regions 142 is a common source/drain region 142 shared by the second reset transistor 132b and the second source follower transistor 134b. Another one of the source/drain regions 142 is a common source/drain region 142 shared by the first row-select transistor 136a and the first source follower transistor 134a. Another one of the source/drain regions 142 is a common source/drain region 142 shared by the second row-select transistor 136b and the second source follower transistor 134b. A pixel device region isolation structure 144 is disposed in the semiconductor substrate 102 and around sides of the transistors within the first and second pixel device regions 130a-b, respectively. The pixel device region isolation structure 144 is configured to provide electrical isolation between the pixel sensor well region 107 and the first and second pixel device regions 130a-b.

In some embodiments, devices (e.g., the aforementioned transistors) within the first pixel device region 130a are configured to control the first and second photodetectors 106a-b and devices (e.g., the aforementioned transistors) within the second pixel device region 130b are configured to control the third and fourth photodetectors 106c-d. In some embodiments, the devices within the first pixel device region 130a and the second pixel device region 130b are point symmetric with respect to the center point 101a of the photodetectors 106a-d. For example, the first and second reset transistors 132a-b are point symmetric with respect to the center point 101a and center points of the first and second reset transistors 132a-b are equidistant from the center point 101a. In a further example, the first and second source follower transistors 134a-b are point symmetric with respect to the center point 101a and center points of the first and second source follower transistors 134a-b are equidistant from the center point 101a. In another example, the first and second row-select transistors 136a-b are point symmetric with respect to the center point 101a and center points of the first and second row-select transistors 136a-b are equidistant from the center point 101a. In some embodiments, the first and second pixel device regions 130a, 130b have rotational symmetry of order 2 with respect to the center point 101a of the photodetectors 106a-d.

As used herein, a structure and/or a set of structures has rotational symmetry if the structure and/or the set of structures looks the same after a rotation (of less than one full turn, e.g. less than 360°) about a center point (e.g., a center point of the structure or a center point of the set of structures). Additionally, as used herein, a structure and/or a set of structures with rotational symmetry of order X (where X is a whole number greater or equal to 1) with respect to a center point can be rotated about the center point to X different positions and look the same at each different position before being rotated more than a full turn (e.g., greater than 360°). For example, a structure and/or a set of structures that has rotational symmetry of order 3 (i.e., order of rotation) with respect to a center point may be rotated about the center point to 3 different positions and look the same at each different position before being rotated more than a full turn (e.g., greater than 360°). In the aforementioned embodiment, the structure and/or set of structures has rotational symmetry with 120° (i.e., degree of rotation) (e.g., the structure and/or set of structures may be rotated 120° and look the same as before the 120° rotation) of rotation with respect to the center point. For example, in some embodiments, such as the illustrated embodiment of FIG. 1A, the plurality of photodetectors 106a-d have rotational symmetry of order four (i.e., rotational symmetry with 90° of rotation) with respect to the center point 101a. In further examples, to determine the degree of rotation for the structure and/or the set of structures, divide 360° by the order of rotation (e.g., in the previous example: 360° divided by 4 equals 90°). Further, rotational symmetry as used herein contemplates that some small asymmetries, such as due to tolerances (e.g., during formation of a device), may be present in the points and/or part of the structure and/or the set of structures that have rotational symmetry.

An interconnect structure 167 overlies the front-side 102f of the semiconductor substrate 102. The interconnect structure 167 includes the ILD structure 168, an inter-metal dielectric (IMD) structure 170, a plurality of metal contacts 152, and a plurality of metal wires 150. The IMD structure 170 surrounds the plurality of metal wires 150. The IMD structure 170 may comprise one or more stacked IMD layers, which respectively comprise a low κ dielectric (i.e., a dielectric with a dielectric constant less than about 3.9), an oxide, or the like. The IMD structure 170 is not shown in FIG. 1A to more easily see the layout of layers and devices disposed over the first-side 102f of the semiconductor substrate 102. The metal wires 150 electrically couple the transfer transistors 124 and the transistors within the first and second pixel device regions 130a-b to overlying metal layers. In some embodiments, the metal contacts 152 extend from the metal wires 150 through the ILD structure 168 to electrode(s), source/drain region(s), and/or floating node(s) disposed over/within the semiconductor substrate 102. In some embodiments, the plurality of metal wires 150 and the metal contacts 152 are point symmetric with respect to the center point 101a of the photodetectors 106a-d. In further embodiments, the plurality of metal wires 150 within outer sidewalls of the DTI structure 110 are point symmetric with respect to the center point 101a. In some embodiments, the plurality of metal wires 150 and the metal contacts 152 respectively have rotational symmetry of order 2 with respect to the center point 101a. In some embodiments, the plurality of metal layers 150 comprises multiple vertical layers vertically offset one another by a plurality of metal vias. In some embodiments, the multiple vertical layers and plurality of metal vias have rotational symmetry of order 2 with respect to the center point 101a.

Symmetry of the aforementioned transistors, regions, and metal structures (e.g., transfer transistors 124, reflectors 109, first and second pixel device regions 130a-b, metal wires 150, and metal contacts 152, photodetectors 106a-d) mitigates non-uniform photodetector-to-photodetector sensitivity across the photodetectors 106a-d. This, in turn, may mitigate conspicuous FPN in images produced by the photodetectors 106a-d, thereby increasing the quality of images reproduced from the photodetectors 106a-d.

Referring to FIG. 1B, a partial-depth DTI structure 166 is disposed between the second and third photodetectors 106b-d. The partial-depth DTI structure 166 is configured to electrically isolate the photodetector collector regions 108 of each photodetector 106a-d. Whereas the DTI structure 110 had a height corresponding to the full thickness of the semiconductor substrate 102, partial depth DT structure 166 has a height that is less than the full thickness of semiconductor substrate 102 and greater than a height of pixel device region isolation structure 144. An anti-reflection layer 164 contacts the pixel sensor well region 107 and the partial-depth DTI structure 166. The anti-reflection layer 164 is configured to reduce the amount of incident radiation reflected by the semiconductor substrate 102. In some embodiments, the anti-reflection layer 164 comprises, for example, an oxide, a high κ dielectric, a nitride, or the like. In further embodiments, the anti-reflection layer 164 may comprise a first layer comprising an oxide stacked on a second layer comprising a high κ dielectric, or vice versa.

A plurality of color filters 162 (e.g., a red color filer, a blue color filter, a green color filer, etc.) directly contact the anti-reflection layer 164. In some embodiments, the color filters 162 are arranged in an array underlying the anti-reflection layer 164. In such an embodiment, the color filters 162 are respectively disposed under the photodetectors 106a-d. The color filters 162 are respectively configured to transmit specific wavelengths of incident radiation. For example, a first color filter (e.g., the red color filter) may transmit light having wavelengths within a first range, while a second color filter (e.g., the blue color filter) may transmit light having wavelengths within a second range different than the first range. Further, a plurality of micro-lenses 160 are disposed under the color filters 162. The micro-lenses 160 are configured to focus incident radiation (e.g., photons) towards the photodetectors 106a-d.

Figures 2A, 2B:
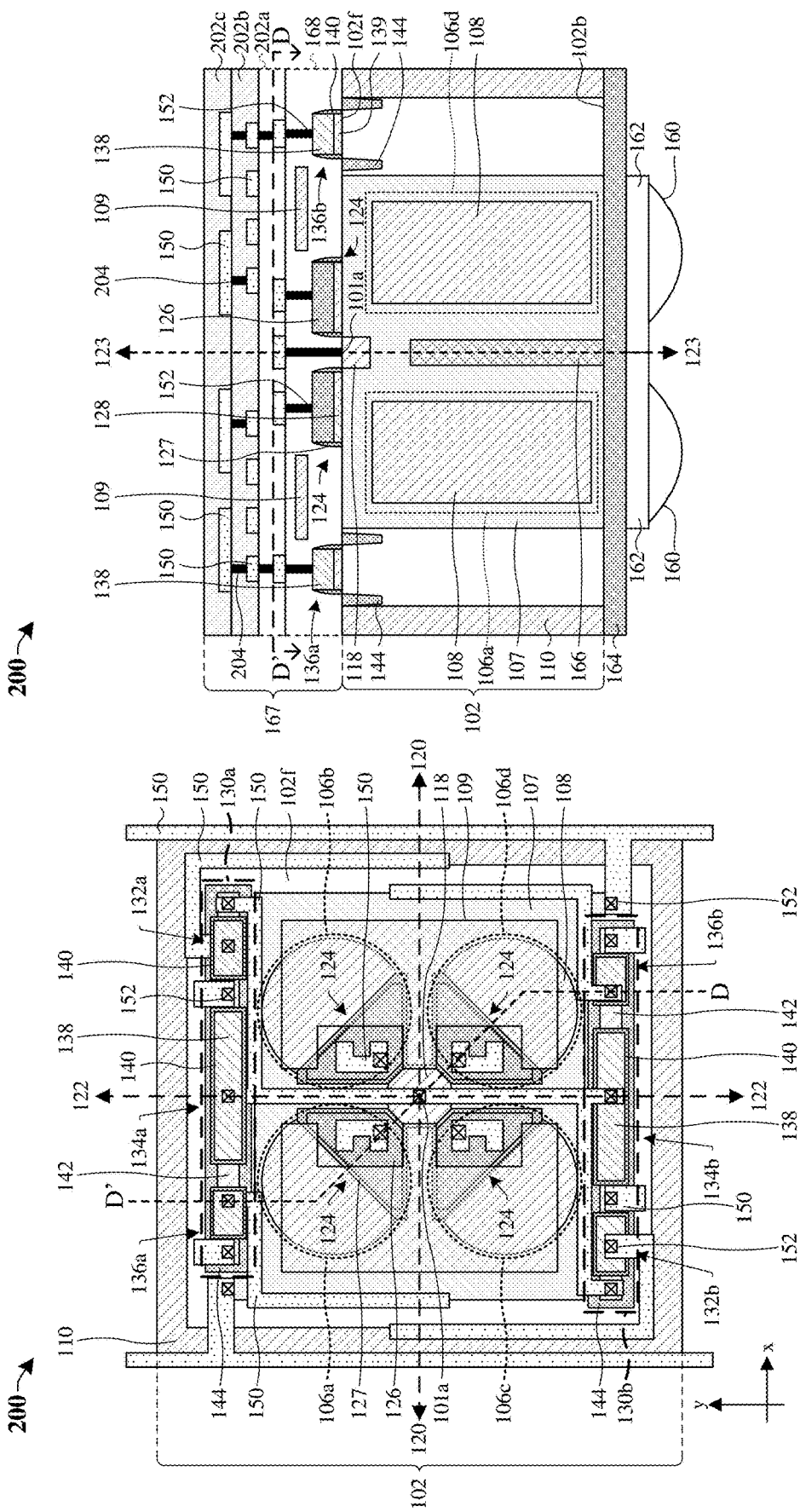
FIGS. 2A-2B illustrate various views of some embodiments of the pixel sensor of FIGS. 1A-1D.

FIGS. 2A-2B illustrates various views of a pixel sensor 200 corresponding to some embodiments of the pixel sensor 100a of FIGS. 1A-1D in which the plurality of transfer transistors 124 comprise a triangular shape with flat corners. FIG. 2B illustrates a cross-sectional view taken along line D-D' of FIG. 2A.

As shown in FIGS. 2A-2B, the plurality of transfer transistors 124, the plurality of photodetectors 106a-d, and the reflectors 109 are reflection symmetric with respect to the first substantially straight line axis 120 and the second substantially straight line axis 122. The plurality of metal wires 150, the metal contacts 152, and pixel devices (e.g., transistors) within the first and second pixel device regions 130a-b are point symmetric with respect to the center point 101a of the photodetectors 106a-d.

Referring to FIG. 2B, the interconnect structure 167 comprises a plurality of ILD layers 202a-c. A plurality of metal vias 204 extend between metal wires 150 within the plurality of ILD layers 202a-c. In some embodiments, the plurality of metal vias 204 may respectively comprise copper, aluminum, or the like. In some embodiments, the plurality of ILD layers 202a-c may respectively comprise a low κ dielectric (i.e., a dielectric with a dielectric constant less than about 3.9), an oxide, or the like. The ILD layer 202a is not shown in FIG. 2A to more easily see the layout of layers and devices disposed over the first-side 102f of the semiconductor substrate 102. In some embodiments, the plurality of metal vias 204 and the plurality of metal wires 150 within the ILD layers 202a-c are point symmetric with respect to the center point 101a of the photodetectors 106a-d. In further embodiments, the plurality of metal wires and vias 150, 204 have a $1^{st}$ order of rotational symmetry with respect to the center point 101a of the photodetectors 106a-d. In yet further embodiments, the plurality of color filters 162 and the plurality of micro-lenses 160 have a $4^{th}$ order of rotational symmetry with respect to the center point 101a of the photodetectors 106a-d.

Figure 3A:
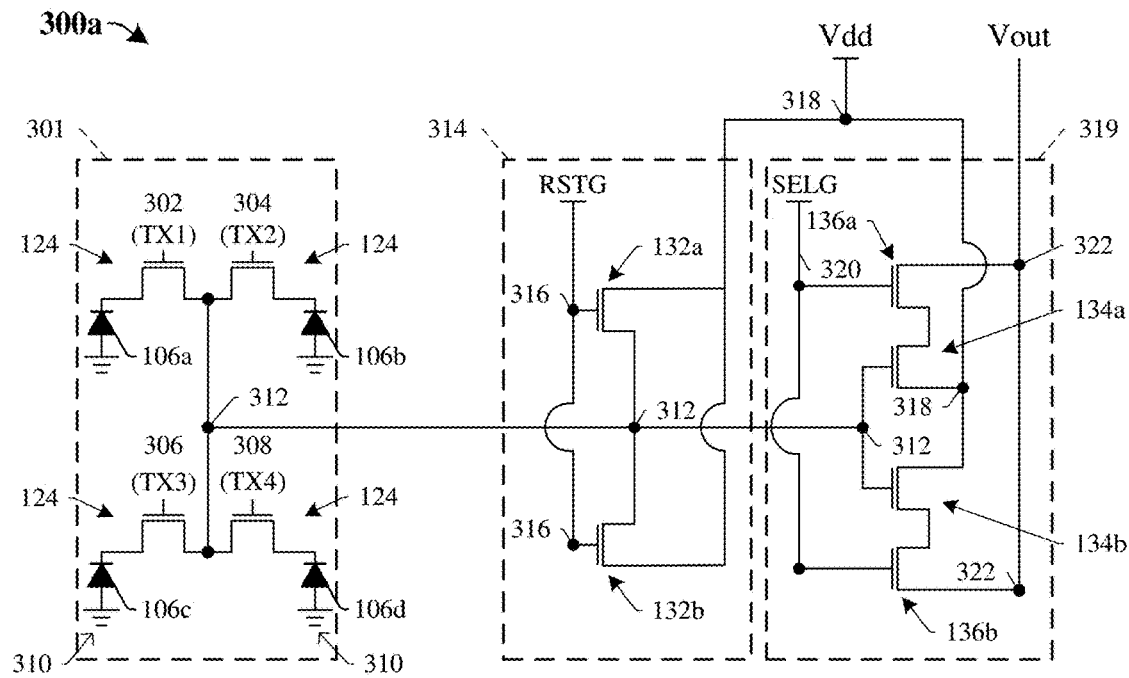
FIG. 3A illustrates a circuit diagram of some embodiments of the pixel sensor of FIG. 1A.
Figure 3B:
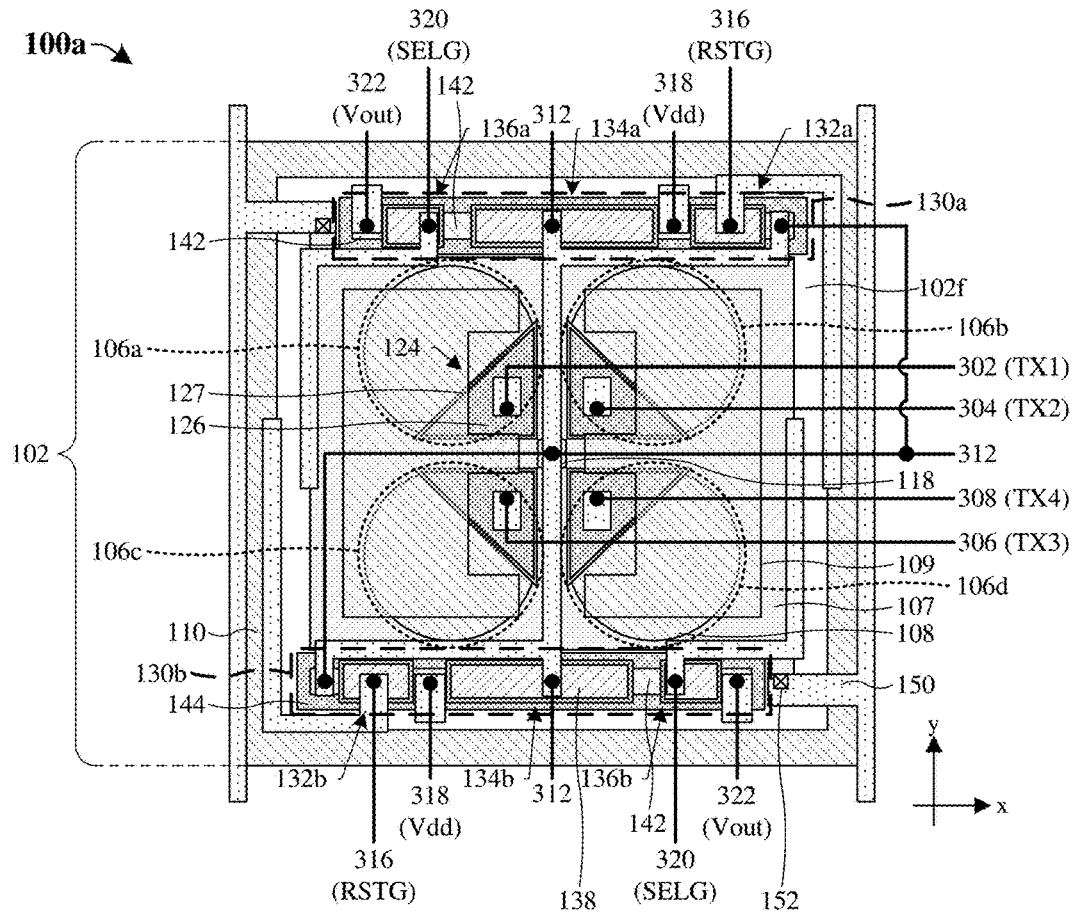
FIG. 3B illustrates a layout view of some embodiments of the pixel sensor of FIG. 1A.

FIG. 3A illustrates a circuit diagram 300a of some embodiments of the pixel sensor 100a of FIG. 1A. FIG. 3B illustrates a layout view of some embodiments of the pixel sensor 100a of FIG. 1A. The layout view of FIG. 3B shows a layout of the regions/layers in and/or around the photodetectors 106a-d. Connections are shown between the semiconductor substrate 102 and terminal and/or node connections. While not shown, connections between the semiconductor substrate 102 and terminal and/or node connections may, for example, be achieved by a back-end-of-line (BEOL) interconnect structure (e.g., the interconnect structure 167 of FIGS. 1B-1D) overlying source/drain regions within the semiconductor substrate 102 and gate terminals overlying the semiconductor substrate 102.

The circuit diagram 300a represents some embodiments of receiving and processing incident electromagnetic radiation disposed upon the photodetectors 106a-d. A charge collection circuit 301 comprises the plurality of photodetectors 106a-d respectively electrically coupled to a first node 312 through the transfer transistors 124. The charge collection circuit 301 is configured to transfer/remove charge collected from the incident electromagnetic radiation within the photodetectors 106a-d to the first node 312. For example, the transfer transistors 124 are configured to respectively remove/transfer charge collected from the incident electromagnetic radiation within the photodetector collector region 108 of the photodetectors 106a-d to the floating diffusion node 118. Transfer voltages are applied to TX1 node 302, TX2 node 304, TX3 node 306, and TX4 node 308 respectively electrically coupled to the pixel device gate electrodes 138 of transfer transistors 124 to control the transfer of charge from the photodetectors 106a-d to the first node 312. In some embodiments, a first source/drain region of each transfer transistor 124 is electrically coupled to a ground node 310 (ground node 310 is electrically coupled to ground) through a respective photodetector 106a-d and a second source/drain region of each transfer transistors 124 is electrically coupled to the first node 312. In the aforementioned embodiment, the transfer transistors 124 are electrically coupled in parallel with one another. The first node 312 is electrically coupled to the floating diffusion node 118, a source/drain region 142 of the first and second reset transistors 132a-b, and the pixel device gate electrode 138 of the first and second source follower transistors 134a-b.

A pre-charge circuit 314 comprises the first and second reset transistors 132a-b electrically coupled in parallel with one another. The pre-charge circuit 314 is electrically coupled to an output terminal (e.g., the first node 312) of the charge collection circuit 301. The pre-charge circuit 314 is configured to set the first node 312 to an initial charge state (e.g., to a first voltage such as 5 volts). During operation of the circuit 300a, the voltage at the first node 312 may be set to and/or may fluctuate from the initial charge state, and the pre-charge circuit 314 may be used to set the voltage at the first node 312 back to the initial charge state. In some embodiments, first source/drain regions 142 of the first and second reset transistors 132a-b are electrically coupled to the first node 312 and second source/drain regions 142 of the first and second reset transistors 132a-b are electrically coupled to a power supply node 318. In some embodiments, the power supply node is electrically coupled to a power supply (e.g., a DC power supply) supplying a voltage (Vdd). In further embodiments, a reset gate (RSTG) voltage is applied to the pixel gate electrodes 138 of the first and second reset transistors 132a-b to apply the voltage at the power supply node 318 to the first node 312.

A charge transfer circuit 319 comprises the first source follower transistor 134a and the first row-select transistor 136a electrically coupled in parallel with the second source follower transistor 134b and the second row-select transistor 136b. An input terminal of the charge transfer circuit 319 is electrically coupled to an output terminal (e.g., the first node 312) of the pre-charge circuit 314. An output terminal of the charge transfer circuit 319 is electrically coupled to an output node 322 (e.g., Vout or a word line). During operation of the circuit 300a, if a charge level at the first node 312 is sufficiently high, the charge transfer circuit 319 is configured to selectively output charge to the output node 322 according to the first and second row-select transistors 136a-b. In some embodiments, first source/drain regions 142 of the first and second source follower transistors 134a-b are each electrically coupled to the power supply node 318. In further embodiments, second source/drain regions 142 of the first and second source follower transistors 134a-b are respectively electrically coupled to a first source/drain region 142 of the first and second row-select transistors 136a-b. Second source/drain regions 142 of the first and second row-select transistors 136a-b are each electrically coupled to the output node 322. A select gate (SELG) voltage is applied to a bit line 320 electrically coupled to the pixel gate electrode 138 of the first and second row-select transistors 136a-b.

In some embodiments, the first reset transistor 132a, the first source follower transistor 134a, and the first row-select transistor 136a are configured to control the first and second photodetectors 106a-b. Additionally, the second reset transistor 132b, the second source follower transistor 134b, and the second row-select transistor 136b are configured to control the third and fourth photodetectors 106c-d. In further embodiments, transistors (e.g., the first reset transistor 132a, the first source follower transistor 134a, and the first row-select transistor 136a) within the first pixel device region 130a are electrically coupled in parallel with respective transistors (e.g., the second reset transistor 132b, the second source follower transistor 134b, and the second row-select transistor 136b) within the second pixel device region 130b.

In some embodiments, during operation of the circuit 300a, if a charge level is sufficiently high within the photodetector collector region 108 of the photodetectors 106a-d while a respective transfer transistor 124 is activated, the first source follower transistor 134a and/or the second source follower transistor 134b is/are activated and charges are selectively output according to operation of the first row-select transistor 136a and/or the second row-select transistor 136b used for addressing. The first reset transistor 132a and/or the second reset transistor 132b may be used to reset (e.g., set to an initial voltage such as 5 volts) the photodetectors 106a-d (e.g., the first reset transistor 132a may reset the first and/or second photodetectors 106a-b and the second reset transistor 132b may reset the third and/or fourth photodetectors 106c-d) between exposure periods of the incident radiation.

FIGS. 4A-4B through 10A-10B illustrate a series of various views of some embodiments of a method for forming the pixel sensor of FIG. 1A. Figures with a suffix of "A" illustrate either a front-side facing top view or a back-side top view of the pixel sensor that correspond to an orientation of the pixel sensor during various formation processes. Figures with a suffix of "B" are taken along line D-D' of Figs. with a suffix of "A". Although the various views shown in FIGS. 4A-4B through 10A-10B are described with reference to a method of forming the pixel sensor, it will be appreciated that the structures shown in FIGS. 4A-4B through 10A-10B are not limited to the method of formation but rather may stand alone separate of the method.

Figure 4B:
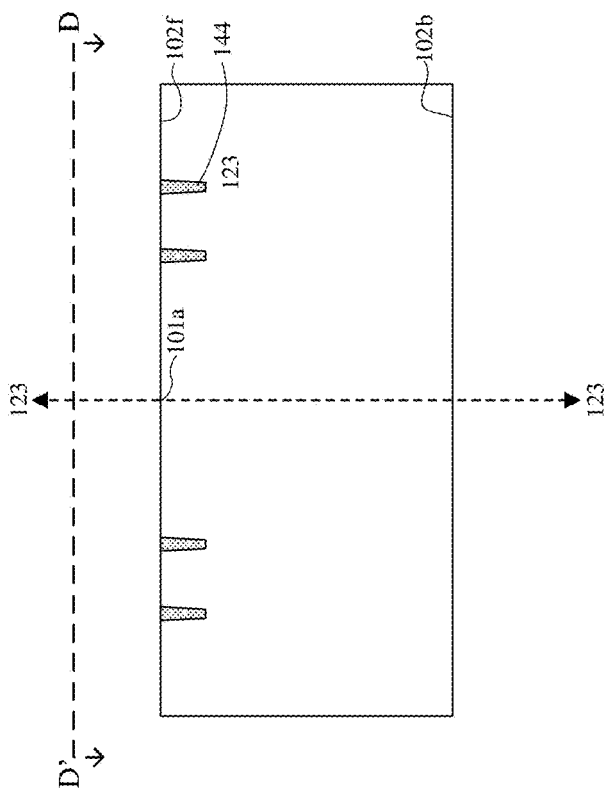
Figure 4A:
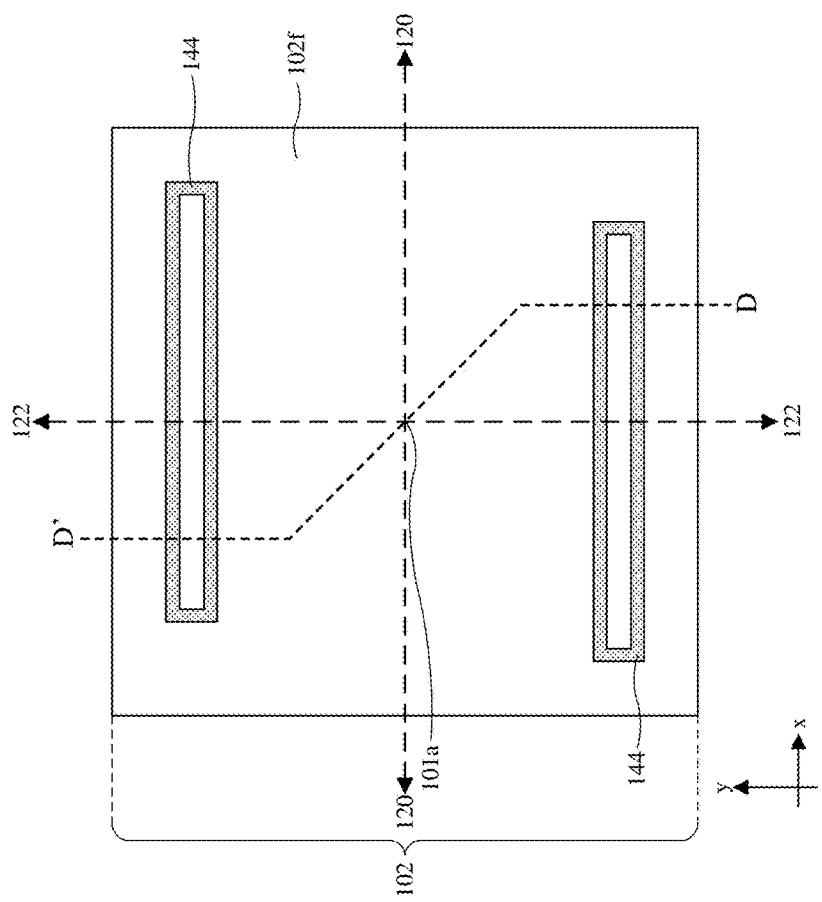

As shown in FIGS. 4A-4B, a pixel device region isolation structure 144 is formed in the semiconductor substrate 102. In some embodiments, the pixel device region isolation structure 144 may be formed by selectively etching the semiconductor substrate 102 to form a trench in the semiconductor substrate 102 that extends into the semiconductor substrate 102 from a front-side 102f of the semiconductor substrate 102, and subsequently filling (e.g., by chemical vapor deposition (CDV), physical vapor deposition (PVD), atomic layer deposition (ALD), thermal oxidation, sputtering, etc.) the trench with a dielectric material. In further embodiments, the semiconductor substrate 102 is selectively etched by forming a masking layer (not shown) on the front-side 102f of the semiconductor substrate 102, and subsequently exposing the semiconductor substrate 102 to an etchant configured to selectively remove unmasked portions of the semiconductor substrate 102. In yet further embodiments, the dielectric material may comprise an oxide (e.g., silicon oxide), a nitride, or the like. In other embodiments, the pixel device region isolation structure 144 may be an isolation well. In such an embodiment, the isolation well may be formed by a selective ion implantation process that utilizes a masking layer (not shown) on the front-side 102f of the semiconductor substrate 102 to selectively implant ions into the semiconductor substrate 102. In some embodiments, the pixel device region isolation structure 144 is formed in such a manner to be point symmetric with respect to a center point 101a. In such an embodiment, the pixel device region isolation structure 144 has first order rotational symmetry with respect to the center point 101a.

Figures 5A, 5B:
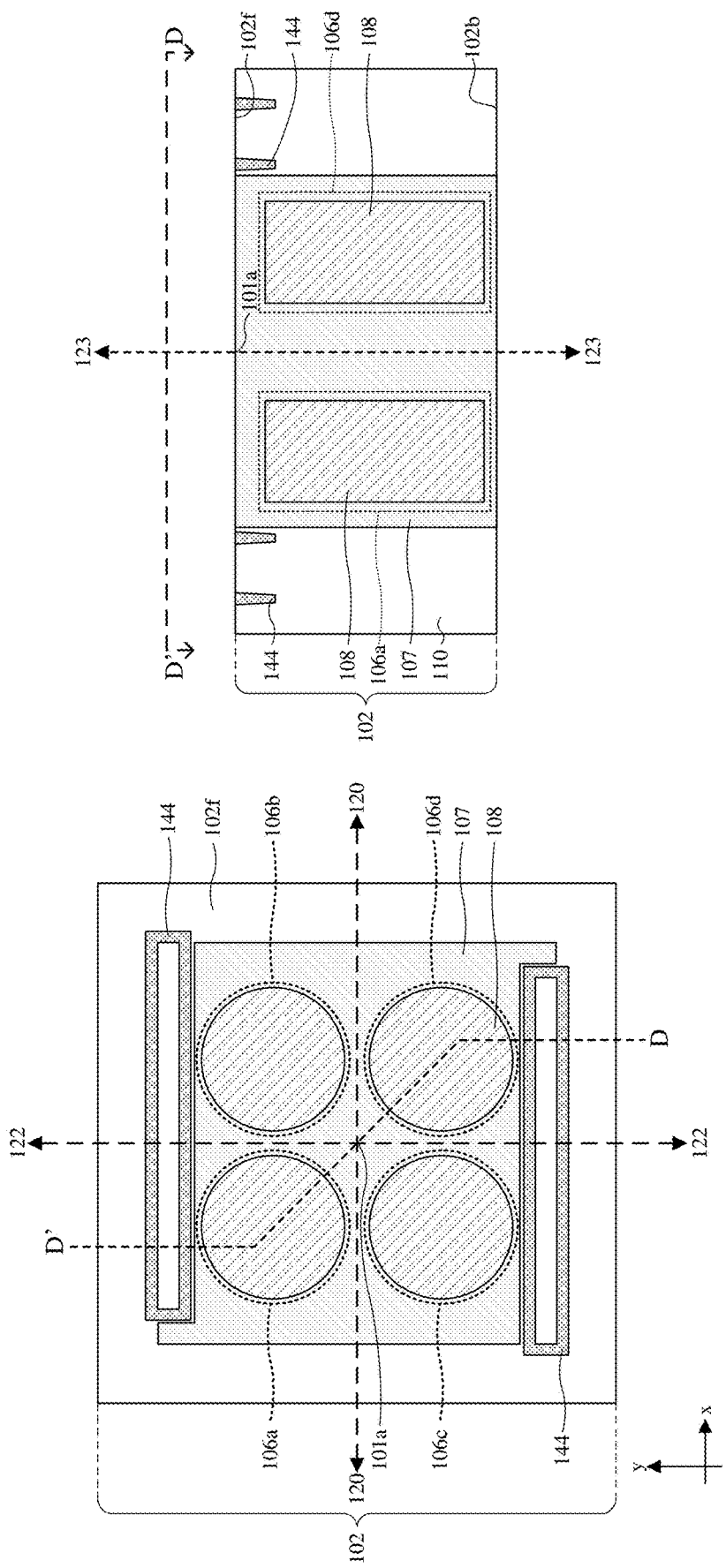

As shown in FIGS. 5A-5B, a pixel sensor well region 107 is formed in the semiconductor substrate 102. The pixel sensor well region 107 is a region of the semiconductor substrate 102 having a first doping type (e.g., p-type doping). In some embodiments, the pixel sensor well region 107 may be formed by a selective ion implantation process that utilizes a masking layer (not shown) on the front-side 102f of the semiconductor substrate 102 to a selectively implant ions into the semiconductor substrate 102. In other embodiments, the pixel sensor well region 107 may be formed by a blanket ion implantation process (e.g., an unmasked ion implantation) to implant ions into the semiconductor substrate 102. In some embodiments, a center point of the pixel sensor well region 107 is aligned with the center point 101a. In further embodiments, the pixel sensor well region 107 is point symmetric with respect to the center point 101a.

Also shown in FIGS. 5A-5B, a plurality of photodetectors 106a-d are formed in the semiconductor substrate 102. The photodetectors 106a-d each comprise a photodetector collector region 108 and portions of the pixel sensor well region 107 disposed around the photodetector collector region 108 in which a depletion region has formed (e.g., due to p-n junctions between the photodetector collector regions 108 and the pixel sensor well region 107).

In some embodiments, a process for forming the photodetectors 106a-d comprises forming a plurality of photodetector collector regions 108 in the pixel sensor well region 107. The photodetector collector regions 108 are discrete regions of the semiconductor substrate 102 having a second doping type (e.g., n-type doping) opposite the first doping type. In some embodiments, the photodetector collector regions 108 may be formed by a selective ion implantation process that utilizes a masking layer (not shown) on the front-side 102f of the semiconductor substrate 102 to selectively implant ions into the semiconductor substrate 102. Because the photodetector collector regions 108 and the pixel sensor well region 107 have opposite doping types, depletion regions (shown as a region surrounded by dotted lines) form in portions of the pixel sensor well region 107 disposed around each photodetector collector region 108.

In some embodiments, the center point 101a is at a center of the photodetectors 106a-d such that a center of each photodetector 106a-d is equidistant from the center point 101a. The photodetectors 106a-d are reflection symmetric with respect to the first substantially straight line axis 120 and with respect to the second substantially straight line axis 122.

Figures 6A, 6B:
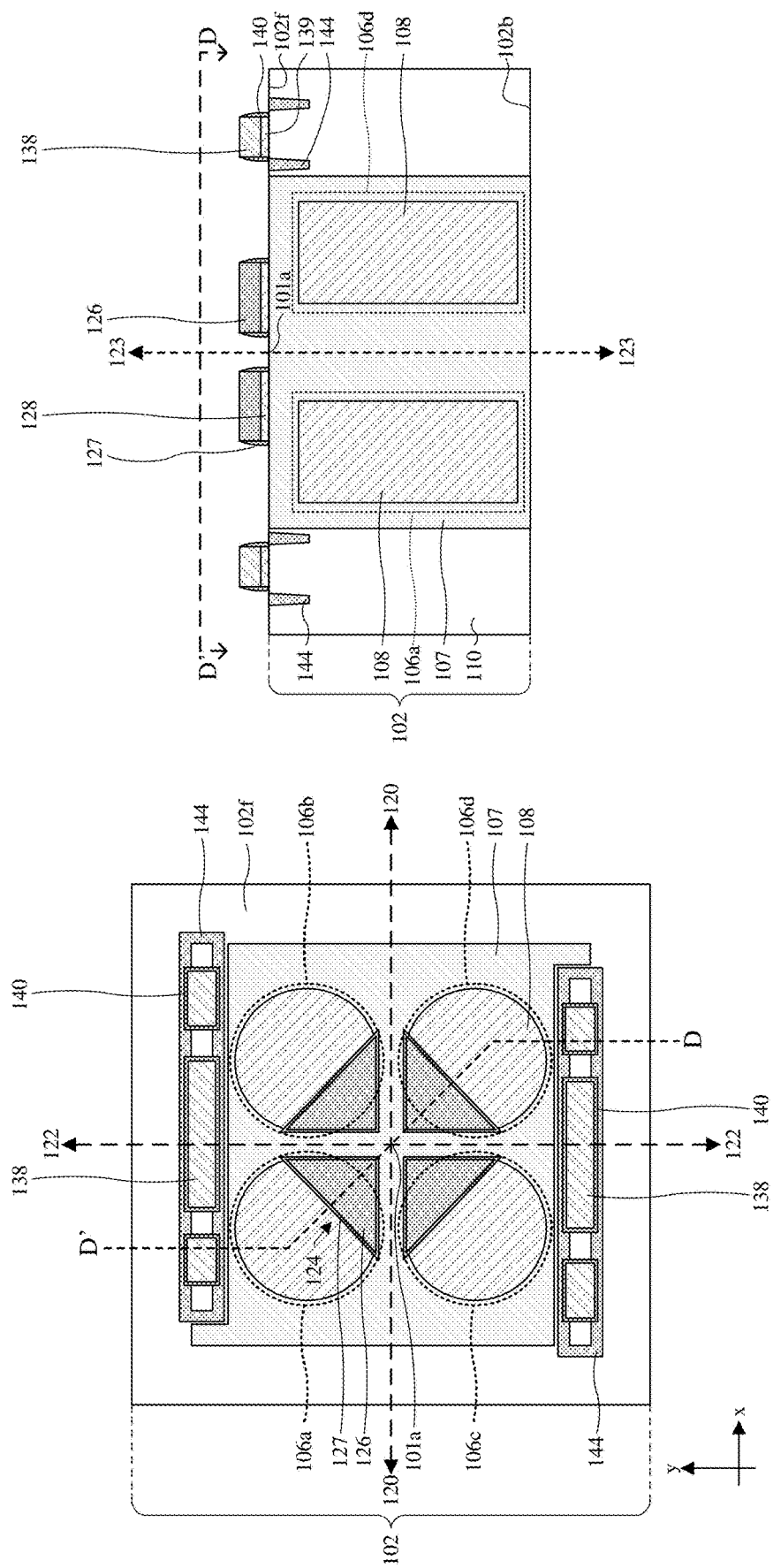

As shown in FIGS. 6A-6B, transfer transistor gate dielectrics 128 are formed on the front-side 102f of the semiconductor substrate 102, and transfer transistor gate electrodes 126 are respectively formed on the transfer transistor gate dielectrics 128. Further, pixel device gate dielectrics 139 are formed on the front-side 102f of the semiconductor substrate 102, and pixel device gate electrodes 138 are respectively formed on the pixel device gate dielectrics 139. In some embodiments, when viewing from the front-side 102f of the semiconductor substrate 102, the transfer transistor gate dielectrics 128 and the transfer transistor gate electrodes 126 may be formed with a triangular layout.

In some embodiments, a process for forming the transfer transistor gate dielectrics 128, the pixel device gate dielectrics 139, the transfer transistor gate electrodes 126, and the pixel device gate electrodes 138 comprises depositing and/or growing (e.g., by CVD, PVD, ALD, thermal oxidation, sputtering, etc.) a gate dielectric layer on the front-side 102f of the semiconductor substrate 102. Next, a gate electrode layer may be deposited on the gate dielectric layer. Subsequently, the gate dielectric layer and the gate electrode layer are patterned and etched to from the transfer transistor gate dielectrics 128, the pixel device gate dielectrics 139, the transfer transistor gate electrodes 126, and the pixel device gate electrodes 138. In further embodiments, the gate electrode layer may comprise, for example, polysilicon, aluminum or the like. In yet further embodiments, the gate dielectric layer may comprise, for example, an oxide, a high κ dielectric, or the like.

Also shown in FIGS. 6A-6B, transfer transistor sidewall spacers 127 are formed on the front-side 102f of the semiconductor substrate 102 and along sidewalls of the transfer transistor gate electrodes 126 and sidewalls of the transfer transistor gate dielectrics 128. Further, pixel device sidewall spacers 140 are formed on the front-side 102f of the semiconductor substrate 102 and along sidewalls of the pixel device gate electrodes 138 and sidewalls of the pixel device gate dielectrics 139.

In some embodiments, the transfer transistor sidewall spacers 127 and the pixel device sidewall spacers 140 may be formed by depositing (e.g., by CVD, PVD, ALD, sputtering, etc.) a spacer layer over the front-side 102f of the semiconductor substrate 102, the transfer transistor gate dielectrics 128, the pixel device gate dielectrics 139, the transfer transistor gate electrodes 126, and the pixel device gate electrodes 138. In further embodiments, the spacer layer is subsequently etched to remove the spacer layer from horizontal surfaces, thereby forming the transfer transistor sidewalls spacers 127 along sidewalls of the transfer transistor gate electrodes 126 and sidewalls of the transfer transistor gate dielectrics 128 and forming the pixel device sidewall spacers 140 along sidewalls of the pixel device gate electrodes 138 and sidewalls of the pixel device gate dielectrics 139. In further embodiments, the spacer layer may comprise a nitride, an oxide, or some other dielectric. In yet further embodiments, before the transfer transistor sidewalls spacer 127 and the pixel device sidewalls spacers 140 are formed, lightly-doped source/drain extensions (not shown) may be formed in the semiconductor substrate 102 on opposing sides of the pixel device gate electrodes 138. In such an embodiment, the lightly-doped source/drain extensions (not shown) may be formed by a selective ion implantation process that utilizes a masking layer (not shown) on the front-side 102f of the semiconductor substrate 102 to selectively implant ions into the semiconductor substrate 102.

As shown in FIGS. 7A-7B, source/drain regions 142 are formed in the semiconductor substrate 102 on opposing sides of the pixel device gate electrodes 138. In some embodiments, the source/drain regions 142 are regions of the semiconductor substrate 102 having the second doping type (e.g., n-type doping). In further embodiments, sides of some of the source/drain regions 142 are substantially aligned with opposing outer sidewalls of the pixel device sidewall spacers 140. In some embodiments, the source/drain regions 142 may contact respective lightly-doped source/drain extensions (not shown). In such an embodiment, the lightly-doped source/drain extensions may have a lower concentration of the second doping type than the source/drain regions 142. In some embodiments, the sides of the lightly-doped source/drain extensions facing the pixel device gate electrodes 138 may align with sidewalls of the pixel device gate electrodes 138 and/or the pixel device gate dielectrics 139. In some embodiments, the source/drain regions 142 may be formed by a selective ion implantation process that utilizes a masking layer (not shown) disposed on the front-side 102f of the semiconductor substrate 102 to selectively implant n-type dopants (e.g., phosphorus) into the semiconductor substrate 102.

In some embodiments, first and second reset transistors 132a-b, first and second source follower transistors 134a-b, and first and second row-select transistors 136a-b each comprise a pixel device gate electrode 138 stacked on a pixel gate dielectric 139. Further, the first and second reset transistors 132a-b, the first and second source follower transistors 134a-b, and the first and second row-select transistors 136a-b each comprise source/drain regions 142 respectively disposed on opposite sides of the pixel device gate electrode 138 and the pixel device gate dielectric 139 stacks. In some embodiments, the first reset transistor 132a, the first source follower transistor 134a, and the first row-select transistor 136a may be disposed within a first pixel device region 130a and the second reset transistor 132b, the second source follower transistor 134b, and the second row-select transistor 136b may be disposed within a second pixel device region 130b. In such an embodiment, outer sides of the pixel device region isolation structures 144 may define outer sides of the first and second pixel device regions 130a-b, respectively.

In some embodiments, transistors within the first and second pixel device regions 130a-b are point symmetric with respect to the center point 101a of the photodetectors 106a-d. In further embodiments, transistors within the first and second pixel device regions 130a-b have first degree rotational symmetry with respect to the center point 101a.

Also shown in FIGS. 7A-7B, a floating diffusion node 118 is formed in the pixel sensor well region 107 between the photodetectors 106a-d. The floating diffusion node 118 is a region of the semiconductor substrate 102 having the second doping type (e.g., n-type doping). In some embodiments, the floating diffusion node 118 may be formed by the first ion implantation process. In such an embodiment, the floating diffusion node 118 and the source/drain regions 142 may have about the same concentration of the second doping type. In other embodiments, the floating diffusion node 118 may be formed by a second selective ion implantation process that utilizes masking layer (not shown) on the front-side 102f of the semiconductor substrate 102 to selectively implant n-type dopants (e.g., phosphorus) into the semiconductor substrate 102. In such an embodiment, the second selective ion implantation process may be performed before the first selective ion implantation process, or vice versa. In further embodiments, an anneal process (e.g., laser anneal, rapid thermal anneal (RTA), etc.) is performed, after the source/drain regions 142 and the floating diffusion node 118 are formed, to active the dopants. In some embodiments, a center point of the floating diffusion node 118 is aligned with the center point 101a of the photodetectors 106a-d.

As shown in FIGS. 8A-8B, an interconnect structure 167 is formed on the front-side 102f of the semiconductor substrate 102. The interconnect structure 167 comprises an ILD structure 168, an IMD structure 170, a plurality of metal contacts 152, and a plurality of metal wires 150. In some embodiments, the ILD structure 168 is formed on the front-side 102f of the semiconductor substrate 102. Reflectors 109 overlying the photodetectors 106a-d are formed within the ILD structure 168. In some embodiments, the reflectors 109 comprise an E-shape and are disposed vertically above the transfer transistor gate electrodes 126. In some embodiments, the reflectors 109 may, for example, be or comprise titanium nitride, tantalum nitride, tantalum, tantalum silicon nitride, titanium silicon nitride, tungsten nitride, tungsten silicon nitride, titanium aluminum, copper, aluminum, aluminum copper, cobalt, ruthenium, iron, iron oxide, platinum, tungsten. In some embodiments, the ILD structure 168 may be formed with a substantially planar upper surface and may comprise an oxide, a nitride, a low κ dielectric, or the like. In some embodiments, the ILD structure 168 may be formed by CVD, PVD, ALD, sputtering, or the like. In further embodiments, a planarization process (e.g., a chemical-mechanical planarization (CMP)) may be performed on the ILD structure 168 to form the substantially planar upper surface.

In some embodiments, the reflectors 109 are reflection symmetric with respect to the first substantially straight line axis 120, with respect to the second substantially straight line axis 122, and with respect to the third substantially straight line axis 123. In some embodiments, the reflectors 109 are point symmetric with respect to the center point 101a. In further embodiments, the reflectors 109 have first order rotational symmetry with respect to the center point 101a.

Also shown in FIGS. 8A-8B, the plurality of metal contacts 152 are formed in the ILD structure 168 that respectively extend through the ILD structure 168 to the transfer transistor gate electrodes 126, the floating diffusion node 118, the source/drain regions 142 (of FIG. 7A), and the pixel device gate electrodes 138. In some embodiments, a process for forming the metal contacts 152 comprises performing an etch into the ILD structure 168 to form contact openings that correspond to the metal contacts 152. In yet further embodiments, the contact openings may be filled by depositing or growing a conductive material (e.g., tungsten) covering the ILD structure 168 that fills the contact openings, and subsequently performing a planarization process (e.g., CMP) on the metal contacts 152 and ILD structure 168.

Also shown in FIGS. 8A-8B, the plurality of metal wires 150 are formed over the ILD structure 168 and over each metal contact 152. In some embodiments, a process for forming the metal wires 150 comprises forming a masking layer (not shown) over the ILD structure 168, performing an etch process into the masking layer to form wire openings that correspond to the metal wires 150, filling the openings with a conductive material (e.g., copper), and subsequently performing a planarization process on the metal wires 150 and the masking layer. In further embodiments, the IMD structure 170 is formed over the metal wires 150. In some embodiments, the IMD structure 170 may be formed by CVD, PVD, ALD, sputtering, or the like. In further embodiments, a planarization process (e.g., a chemical-mechanical planarization (CMP)) may be performed on the IMD structure 170. In some embodiments, the IMD structure 170 may, for example, be or comprise an oxide, a nitride, a low κ dielectric, or the like. In some embodiments, the metal wires 150 may, for example, be or comprise titanium nitride, tantalum nitride, tantalum, tantalum silicon nitride, titanium silicon nitride, tungsten nitride, tungsten silicon nitride, titanium aluminum, copper, aluminum, aluminum copper, cobalt, ruthenium, iron, iron oxide, platinum, tungsten, or the line. In some embodiments, the reflectors 109 are comprised of a first material different than a second material the metal wires 150 are comprised of.

In some embodiments, the metal wires 150 and the metal contacts 152 are point symmetric with respect to the center point 101a of the photodetectors 106a-d. In further embodiments, the metal wires 150 and the metal contacts 152 have first order rotational symmetry with respect to the center point 101a.

As shown in FIGS. 9A-9B, in some embodiments, the semiconductor substrate 102 is thinned, such that the semiconductor substrate 102 has a reduced thickness. In some embodiments, the thinning may expose the pixel sensor well region 107 on the back-side 102b of the semiconductor substrate 102. The thinning may be, for example, performed by a planarization process, an etch back process, a grinding process, or the like. In further embodiments, the planarization process may be a CMP process. A deep trench isolation (DTI) structure 110 is formed in the semiconductor substrate 102. The DTI structure 110 extends into the semiconductor substrate 102 from a front-side 102f of the semiconductor substrate 102 to a back-side 102b of the semiconductor substrate 102. In some embodiments, the photodetectors 106a-d and the first and second pixel device regions 130a-b are within inner sidewalls of the DTI structure 110. A partial-depth DTI structure 166 is formed in the semiconductor substrate 102. The partial-depth DTI structure 166 extends from a back-side 102b of the semiconductor substrate 102 to a position vertically above the front-side 102f of the semiconductor substrate 102. The partial-depth DTI structure 166 is positioned laterally between the photodetectors 106a-d. In some embodiments, the DTI structure 110 and the partial-depth DTI structure 166 each may, for example, be or comprise an oxide, a nitride, or the like.

In some embodiments, a process for forming the DTI structure 110 and/or the partial-depth DTI structure 166 comprises selectively etching the semiconductor substrate 102 to form trenches in the semiconductor substrate 102 that extend into the semiconductor substrate 102 from the back-side 102b of the semiconductor substrate 102, and subsequently filling the trenches (e.g., by CVD, PVD, ALD, thermal oxidation, sputtering, etc.) with a dielectric material.

In some embodiments, a center point of the DTI structure 110 is aligned with the center point 101a of the photodetectors 106a-d. In further embodiments, the DTI structure 110 is reflection symmetric with respect to the first substantially straight line axis 120, with respect to the second substantially straight line axis 122, and with respect to the third substantially straight line axis 123. In some embodiments, the DTI structure 110 is point symmetric with respect to the center point 101a. In further embodiments, DTI structure 110 has fourth order rotational symmetry with respect to the center point 101a.

In some embodiments, a center point of the partial-depth DTI structure 166 is aligned with the center point 101a of the photodetectors 106a-d. In further embodiments, the partial-depth DTI structure 166 is reflection symmetric with respect to the first substantially straight line axis 120, with respect to the second substantially straight line axis 122, and with respect to the third substantially straight line axis 123. In some embodiments, the partial-depth DTI structure 166 is point symmetric with respect to the center point 101a. In further embodiments, the partial-depth DTI structure 166 has fourth order rotational symmetry with respect to the center point 101a.

As shown in FIGS. 10A-10B, an anti-reflection layer 164 is formed on the back-side 102b of the semiconductor substrate 102. In some embodiments, the anti-reflection layer 164 is formed on the pixel sensor well region 107, the partial-depth DTI structure 166, and the DTI structure 110. The anti-reflection layer 164 is configured to reduce the amount of incident radiation reflected by the semiconductor substrate 102. In some embodiments, the anti-reflection layer 164 may be formed by CVD, PVD, ALD, sputtering, or the like. In further embodiments, the anti-reflection layer 164 may be planarized (e.g., via CMP) subsequent to formation.

Also shown in FIGS. 10A-10B, a plurality of color filters 162 (e.g., a red color filter, a blue color filter, a first green color filter, and/or a second green color filter) are formed on the anti-reflection layer 164. In some embodiments, center points of the plurality of color filters 162 are aligned in a vertical direction with center points of the photodetector collector regions 108, respectively. In further embodiments, the plurality of color filters 162 may be formed by forming various color filter layers and patterning the color filter layers. The color filter layers are formed of material that allows for the transmission of incident radiation (e.g., light) having a specific wavelength range, while blocking light of wavelengths outside of the specified range. Further, in some embodiments, the color filter layers may be planarized (e.g., via CMP) subsequent to formation.

A plurality of micro-lenses 160 are formed over the plurality of color filters 162. In some embodiments, center points of the micro-lenses 160 are aligned in a vertical direction with center points of the color filters 162, respectively. In further embodiments, the micro-lenses 160 may be formed by depositing a micro-lens material on the color filters 162 (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The micro-lenses 160 are then formed by selectively etching the micro-lens material according to the micro-lens template.

In some embodiments, the plurality of color filters 162 are reflection symmetric with respect to the first substantially straight line axis 120, with respect to the second substantially straight line axis 122, and with respect to the third substantially straight line axis 123. In some embodiments, the plurality of micro-lenses 160 are reflection symmetric with respect to the first substantially straight line axis 120, with respect to the second substantially straight line axis 122, and with respect to the third substantially straight line axis 123.

Figure 11:
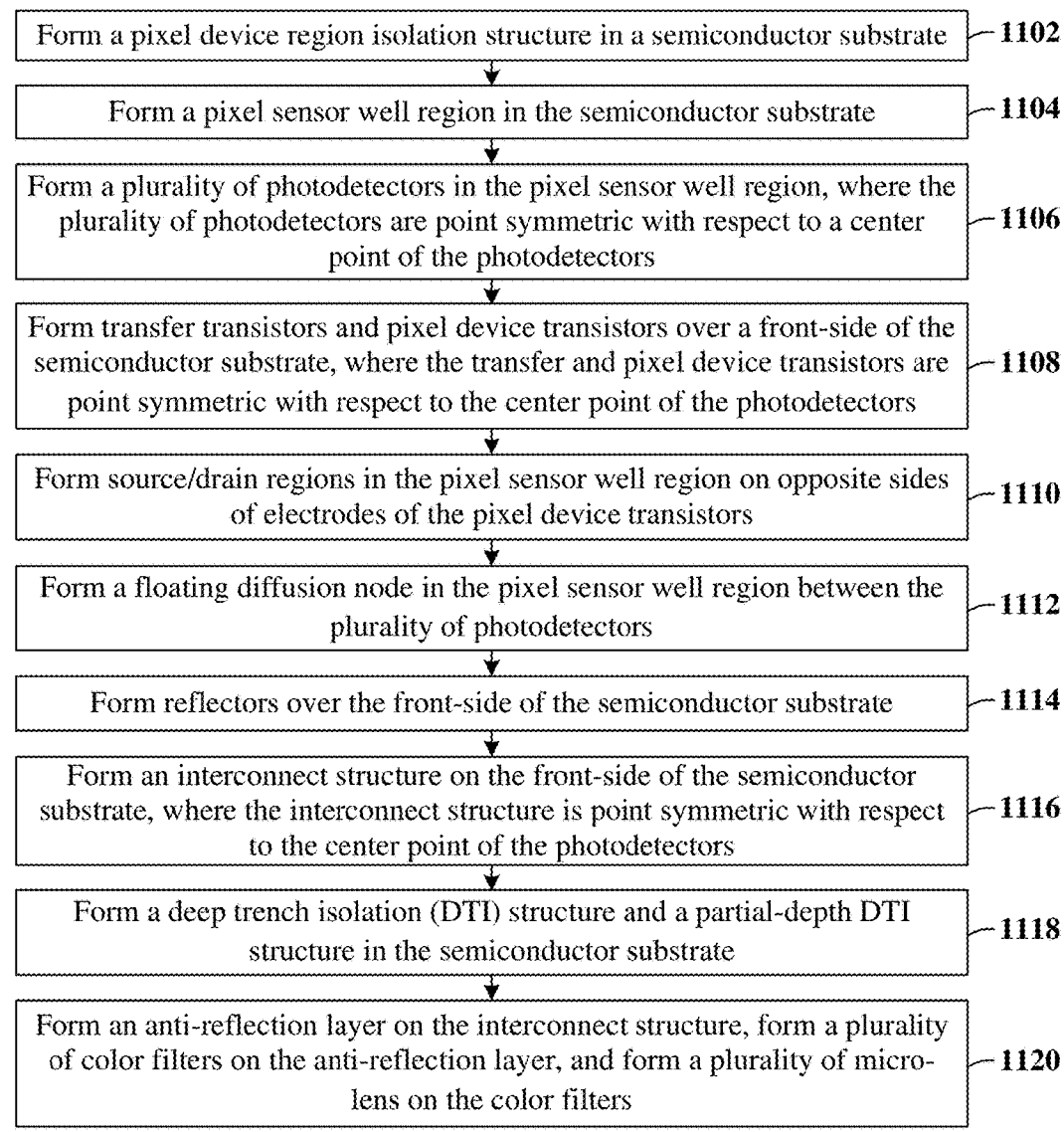
FIG. 11 illustrates a flowchart of some embodiments of a method for forming the pixel sensor of FIG. 1A.

As illustrated in FIG. 11, a flowchart 1100 of some embodiments of a method for forming the pixel sensor of FIGS. 1A-1D is provided. While the flowchart 1100 of FIG. 11 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1102, a pixel device region isolation structure is formed in a semiconductor substrate. FIGS. 4A-4B illustrate various views of some embodiments corresponding to act 1102.

At 1104, a pixel sensor well region is formed in the semiconductor substrate. FIGS. 5A-5B illustrate various views of some embodiments corresponding to act 1104.

At 1106, a plurality of photodetectors are formed in the pixel sensor well region, where the plurality of photodetectors are point symmetric with respect to a center point of the photodetectors. FIGS. 5A-5B illustrate various views of some embodiments corresponding to act 1106.

At 1108, transfer transistors and pixel device transistors are formed over a front-side of the semiconductor substrate, where the transfer and pixel device transistors are point symmetric with respect to the center point of the photodetectors. FIGS. 6A-6B illustrate various views of some embodiments corresponding to act 1108.

At 1110, source/drain regions are formed in the pixel sensor well region on opposite sides of electrodes of the pixel device transistors. FIGS. 7A-7B illustrate various views of some embodiments corresponding to act 1110.

At 1112, a floating diffusion node is formed in the pixel sensor well region between the plurality of photodetectors. FIGS. 7A-7B illustrate various views of some embodiments corresponding to act 1112.

At 1114, reflectors are formed over the front-side of the semiconductor substrate. FIGS. 8A-8B illustrate various views of some embodiments corresponding to act 1114.

At 1116, an interconnect structure is formed on the front-side of the semiconductor substrate, where the interconnect structure is point symmetric with respect to the center point of the photodetectors. FIGS. 8A-8B illustrate various views of some embodiments corresponding to act 1116.

At 1118, a deep trench isolation (DTI) structure and a partial-depth DTI structure is formed in the semiconductor substrate. FIGS. 9A-9B illustrate various views of some embodiments corresponding to act 1118.

At 1120, an anti-reflection layer is formed on the interconnect structure, a plurality of color filters are formed on the anti-reflection layer, and a plurality of micro-lens are formed on the color filters. FIGS. 10A-10B illustrate various views of some embodiments corresponding to act 1120.

Accordingly, in some embodiments, the present disclosure relates to a pixel sensor comprising a plurality of photodetectors, transfer transistors, pixel device transistors, reflectors, and an interconnect structure. The plurality of photodetectors, transfer transistors, pixel device transistors, reflectors, and interconnect structure are point symmetric with respect to a center point of the plurality of photodetectors.

In some embodiments, the present application provides an image sensor, including a plurality of photodetectors disposed within a substrate; a first plurality of semiconductor devices disposed over a first side of the substrate; a second plurality of semiconductor devices disposed over the first side of the substrate; and wherein the first and second plurality of semiconductor devices are disposed on opposing sides of the plurality of photodetectors such that the plurality of photodetectors are spaced laterally between the first and second plurality of semiconductor devices, and wherein the first and second plurality of semiconductor devices are laterally offset from the plurality of photodetectors.

In some embodiments, the present application provides an image sensor, including a pixel well region disposed within a substrate and comprising a first pair of photodetectors neighboring a second pair of photodetectors, wherein the first and second pair of photodetectors are each configured to convert radiation that enters the substrate into an electrical signal; a first plurality of semiconductor devices overlying a front-side of the substrate and laterally adjacent to the first pair of photodetectors, wherein the first plurality of semiconductor devices is configured to receive the electrical signal from the first pair of photodetectors; a second plurality of semiconductor devices overlying the front-side of the substrate and laterally adjacent to the second pair of photodetectors, wherein the second plurality of semiconductor devices is configured to receive the electrical signal from the second pair of photodetectors; and wherein the first and second plurality of semiconductor devices are spaced on opposing sides of the pixel well region, and wherein the first plurality of semiconductor devices is electrically coupled in parallel with the second plurality of semiconductor devices.

In some embodiments, the present application provides a method for forming an image sensor, the method including forming a doped well region having a first doping type in a substrate; forming a plurality of photodetectors having a second doping type different than the first doping type in the doped well region; forming a first plurality of semiconductor devices laterally adjacent to a first sidewall of the doped well region; forming a second plurality of semiconductor devices laterally adjacent to a second sidewall of the doped well region; and wherein the first sidewall of the doped well region is opposite the second sidewall of the doped well region, wherein the plurality of photodetectors are spaced laterally between the first and second plurality of semiconductor devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a plurality of photodetectors disposed within a substrate;
a first plurality of semiconductor devices disposed over a first side of the substrate;
a second plurality of semiconductor devices disposed over the first side of the substrate;
wherein the first and second plurality of semiconductor devices are disposed on opposing sides of the plurality of photodetectors such that the plurality of photodetectors are spaced laterally between the first and second plurality of semiconductor devices, wherein the first and second plurality of semiconductor devices are laterally offset from the plurality of photodetectors, and wherein the first and second plurality of semiconductor devices have at least second order rotational symmetry with respect to a center point of the plurality of photodetectors; and
a plurality of conductive reflectors overlying the photodetectors, wherein the conductive reflectors are symmetric about a line extending through the center point.

2. The image sensor of claim 1, wherein the plurality of photodetectors has rotational symmetry with respect to the center point.

3. The image sensor of claim 1, wherein the first and second plurality of semiconductor devices are configured as transistors, respectively.

4. The image sensor of claim 1, further comprising:
a plurality of transfer transistors overlying each photodetector, wherein the transfer transistors are spaced laterally between the first and second plurality of semiconductor devices.

5. The image sensor of claim 1, wherein the first and second plurality of semiconductor devices comprise a reset transistor, a source follower transistor, and a select transistor, respectively.

6. The image sensor of claim 1, further comprising:
a plurality of conductive wires overlying the first and second plurality of semiconductor devices, wherein the conductive wires have at least second order rotational symmetry with respect to the center point.

7. The image sensor of claim 6, wherein a first conductive wire in the plurality of conductive wires extends continuously from directly above a first gate electrode in the first plurality of semiconductor devices to directly above a gate electrode in the second plurality of semiconductor devices.

8. The image sensor of claim 7, wherein the first conductive wire is disposed along the line extending through the center point of the plurality of photodetectors.

9. An image sensor, comprising:
a pixel well region disposed within a substrate and comprising a first pair of photodetectors neighboring a second pair of photodetectors, wherein the first and second pair of photodetectors are each configured to convert radiation that enters the substrate into an electrical signal;
a first plurality of semiconductor devices overlying a front-side of the substrate and laterally adjacent to the first pair of photodetectors, wherein the first plurality of semiconductor devices is configured to receive the electrical signal from the first pair of photodetectors;
a second plurality of semiconductor devices overlying the front-side of the substrate and laterally adjacent to the second pair of photodetectors, wherein the second plurality of semiconductor devices is configured to receive the electrical signal from the second pair of photodetectors; and
wherein the first and second plurality of semiconductor devices are spaced on opposing sides of the pixel well region, wherein the first plurality of semiconductor devices is electrically coupled in parallel with the second plurality of semiconductor devices, wherein a gate electrode of a first semiconductor device in the first plurality of semiconductor devices is directly electrically coupled to a gate electrode of a second semiconductor device in the second plurality of semiconductor devices.

10. The image sensor of claim 9, wherein the first and second plurality of semiconductor devices are point symmetric with respect to a center point of the pixel well region.

11. The image sensor of claim 9, further comprising:
an interconnect structure comprising a plurality of conductive wires and vias overlying the front-side of the substrate and electrically coupled to the first and second pair of photodetectors and the first and second plurality of semiconductor devices.

12. The image sensor of claim 11, wherein the interconnect structure is symmetric with respect to a center point of the pixel well region.

13. The image sensor of claim 11, wherein a first conductive wire in the interconnect structure continuously extends from the gate electrode of the first semiconductor device in the first plurality of semiconductor devices to the gate electrode of the second semiconductor device in the second plurality of semiconductor devices.

14. The image sensor of claim 9, further comprising:
a trench isolation structure enclosing an outer perimeter of the pixel well region, wherein the trench isolation structure extends from a back-side of the substrate to a position in the substrate, wherein the first and second plurality of semiconductor devices are spaced laterally between opposing sidewalls of the trench isolation structure.

15. The image sensor of claim 14, wherein the trench isolation structure extends from the back-side of the substrate to the front-side of the substrate, wherein the back-side of the substrate is opposite the front-side of the substrate.

16. The image sensor of claim 9, further comprising
a first pixel device isolation structure disposed within the substrate and laterally enclosing the first plurality of semiconductor devices; and
a second pixel device isolation structure disposed within the substrate and laterally enclosing the second plurality of semiconductor devices; and
wherein the first and second pair of photodetectors are spaced laterally between the first and second pixel device isolation structures.

17. A method for forming an image sensor, the method comprising:
forming a doped well region having a first doping type in a substrate;
forming a plurality of photodetectors having a second doping type different than the first doping type in the doped well region;
forming a first plurality of semiconductor devices laterally adjacent to a first sidewall of the doped well region;
forming a second plurality of semiconductor devices laterally adjacent to a second sidewall of the doped well region;
wherein the first sidewall of the doped well region is opposite the second sidewall of the doped well region, wherein the plurality of photodetectors are spaced laterally between the first and second plurality of semiconductor devices; and
forming a plurality of conductive reflectors over the plurality of photodetectors, wherein the conductive reflectors are symmetric about a line extending through a center point of the plurality of photodetectors.

18. The method of claim 17, wherein the first and second plurality of semiconductor devices are formed concurrently with one another.

19. The method of claim 17, wherein the first and second plurality of semiconductor devices have at least second order rotational symmetry with respect to the center point of the plurality of photodetectors.

20. The method of claim 17, further comprising:
forming a plurality of transfer transistors over the plurality of photodetectors such that the plurality of transfer transistors is spaced laterally between the first and second plurality of semiconductor devices.

* * * * *